US012775160B2

(12) United States Patent
Veeraraghavan et al.

(10) Patent No.: US 12,775,160 B2
(45) Date of Patent: Oct. 27, 2026

(54) OPTIMIZATION OF DIFFRACTIVE LENSLESS CAMERAS FOR IMAGING AND COMPUTER VISION APPLICATIONS

(71) Applicant: William Marsh Rice University, Houston, TX (US)

(72) Inventors: Ashok Veeraraghavan, Houston, TX (US); Jacob Robinson, Houston, TX (US); Vivek Boominathan, Houston, TX (US); Jesse Adams, Houston, TX (US); Richard Baraniuk, Houston, TX (US)

(73) Assignee: William Marsh Rice University, Houston, TX (US)

( * ) Notice: Subject to any disclaimer, the term of this patent is extended or adjusted under 35 U.S.C. 154(b) by 1357 days.

(21) Appl. No.: 17/643,562

(22) Filed: Dec. 9, 2021

(65) Prior Publication Data

US 2025/0377536 A1 Dec. 11, 2025

Related U.S. Application Data

(60) Provisional application No. 63/123,033, filed on Dec. 9, 2020.

(51) Int. Cl.

| | |
|---|---|
| ***G02B 27/00*** | (2006.01) |
| ***G02B 27/46*** | (2006.01) |
| ***G06F 30/27*** | (2020.01) |

(52) U.S. Cl.

CPC ......... *G02B 27/0012* (2013.01); *G02B 27/46* (2013.01); *G06F 30/27* (2020.01)

(58) Field of Classification Search

None

See application file for complete search history.

(56) References Cited

U.S. PATENT DOCUMENTS

| | | | |
|---|---|---|---|
| 10,663,750 B2 * | 5/2020 | Yu | G02B 27/58 |
| 10,753,869 B2 | 8/2020 | Veeraraghavan et al. | |
| 2008/0253675 A1 * | 10/2008 | Chou | G06T 7/13 382/255 |
| 2018/0027201 A1 | 1/2018 | Sankaranarayanan et al. | |
| 2018/0247106 A1 * | 8/2018 | Javidi | G02B 21/0008 |
| 2020/0264417 A1 * | 8/2020 | Agrawal | G02B 21/0072 |
| 2020/0310099 A1 * | 10/2020 | Zheng | G02B 27/58 |

OTHER PUBLICATIONS

Li, Y., Wu, Y.-L., Hoess, P., Mund, M., & Ries, J. (2019). Depth-dependent PSF calibration and aberration correction for 3D single-molecule localization. Biomedical Optics Express, 10(6), 2708-2718. https://doi.org/10.1364/BOE.10.002708 (Year: 2019).*

(Continued)

*Primary Examiner* — Amandeep Saini
*Assistant Examiner* — Caroline Tabancay Duffy
(74) *Attorney, Agent, or Firm* — Osha Bergman Watanabe & Burton LLP

(57) ABSTRACT

A method for designing and optimizing a lensless imaging device includes: (a) a method for optimizing the point spread function for various imaging, computer vision and artificial intelligence tasks, (b) a method for computing the optimal phase mask that can realize the desired point spread function, (c) using the optimal phase mask in a lensless camera and (d) a method for calibrating the lensless imaging device using a single captured image.

19 Claims, 24 Drawing Sheets

(56) References Cited

OTHER PUBLICATIONS

Yicheng Wu, Boominathan, V., Huaijin Chen, Sankaranarayanan, A., & Veeraraghavan, A. (2019). PhaseCam3D—Learning Phase Masks for Passive Single View Depth Estimation. IEEE International Conference on Computational Photography, 1-12. https://doi.org/10.1109/ICCPHOT.2019.8747330 (Year: 2019).*
Jia, P., Wu, X., Yang, X., Huang, Y., Cai, B., & Cai, D. (2020). Astronomical image restoration and point spread function estimation with deep neural networks (C. d'Orgeville & S. C. Ellis, Eds.; vol. 11203, pp. 112030Q-112030Q-4). SPIE. https://doi.org/10.1117/12.2541083 (Year: 2020).*
Xu, F., et al. (2020). Three-dimensional nanoscopy of whole cells and tissues with in situ point spread function retrieval. Nature Methods, 17(5), 531-540. https://doi.org/10.1038/s41592-020-0816-x. (Year: 2020).*
Joshi, N., Szeliski, R., & Kriegman, D. J. (2008). PSF estimation using sharp edge prediction. 2008 IEEE Conference on Computer Vision and Pattern Recognition, 1-8. https://doi.org/10.1109/CVPR.2008.4587834 (Year: 2008).*
Chi, W., & George, N. (2009). Phase-coded aperture for optical imaging. Optics Communications, 282(11), 2110-2117. https://doi.org/10.1016/j.optcom.2009.02.031 (Year: 2009).*
Sitzmann, V. et al. (2018). End-to-end optimization of optics and image processing for achromatic extended depth of field and super-resolution imaging. ACM Transactions on Graphics, 37(4), Article 114. https://doi.org/10.1145/3197517.3201333. (Year: 2018).*

* cited by examiner

200

800

1250

OPTIMIZATION OF DIFFRACTIVE LENSLESS CAMERAS FOR IMAGING AND COMPUTER VISION APPLICATIONS

CROSS-REFERENCE TO RELATED APPLICATIONS

This application claims the benefit of U.S. Provisional Application 63/123,033 filed on Dec. 9, 2020 and is hereby incorporated by reference in its entirety.

STATEMENT REGARDING FEDERALLY SPONSORED RESEARCH OR DEVELOPMENT

This disclosure was made with Government Support under Grant Numbers CCF-1502875, CCF-1527501, and U.S. Pat. No. 1,652,633 awarded by the National Science Foundation, as well as Grant Number N66001-17-C-4012 awarded by Defense Advanced Research Projects Agency. The government has certain rights in the invention.

BACKGROUND

Related documents include: US Patent Publication No. 20180027201A1 and U.S. Pat. No. 10,753,869.

A myriad of emerging applications such as wearables, implantables, autonomous cars, robotics, inter-net of things (IoT), virtual/augmented reality, and human-computer interaction are driving the miniaturization of cameras. The use of traditional lenses adds weight and cost, are rigid and occupies volume, and have a stringent requirement of focusing distance that is proportional to the aperture. For these reasons, a radical redesign of camera optics is necessary to meet the miniaturization demands. Recently, lensless cameras were demonstrated to achieve small form factors by foregoing the need to capture "image" like measurements on the sensor. Instead, what these cameras capture are highly multiplexed measurements which are computationally demultiplexed into images by incorporating calibrated camera responses. Inevitably, these cameras have point-spread-functions with large support. The design of the point-spread-functions (PSFs) is instrumental in guaranteeing high-quality reconstructions—however, current lensless designs lack the precise control of point-spread-functions. In other words, current lensless cameras are low-resolution, have inefficient light-throughput and lack flexible design. Thus, there is need of designing optical elements for achieving light efficient, lensless, and high-resolution lensless imaging devices.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein generally relate to a method to design and optimize diffractive optical elements for creating light efficient, lensless, and high resolution lensless imaging devices. Additionally, the method includes implementing low-level feature extraction at sensing level which may be used for vision tasks and may reduce power consumption. In particular, the method includes determining one or more optimal point spread functions for a particular application. The method further includes determining optimal phase masks based on the optimal point spread functions and using designed optimal phase masks in a lensless camera.

In addition, embodiments disclosed herein details a method for precisely determining the mask location and calibrating lens-free imaging systems faster and more efficiently. Also detailed is the process for using a single calibration data set for unlimited multiple devices, leading to ease of commercialization.

In another aspect, embodiments disclosed herein generally relate to a non-transitory computer readable medium storing instruction. The instructions are executable by a computer processor and include functionality for: determining one or more optimal point spread functions for a particular application. The instructions further include determining optimal phase masks based on the optimal point spread functions and using designed optimal phase masks in a lensless camera.

Other aspects and advantages of one or more embodiments disclosed herein will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION OF THE DISCLOSURE

Figure 1A:
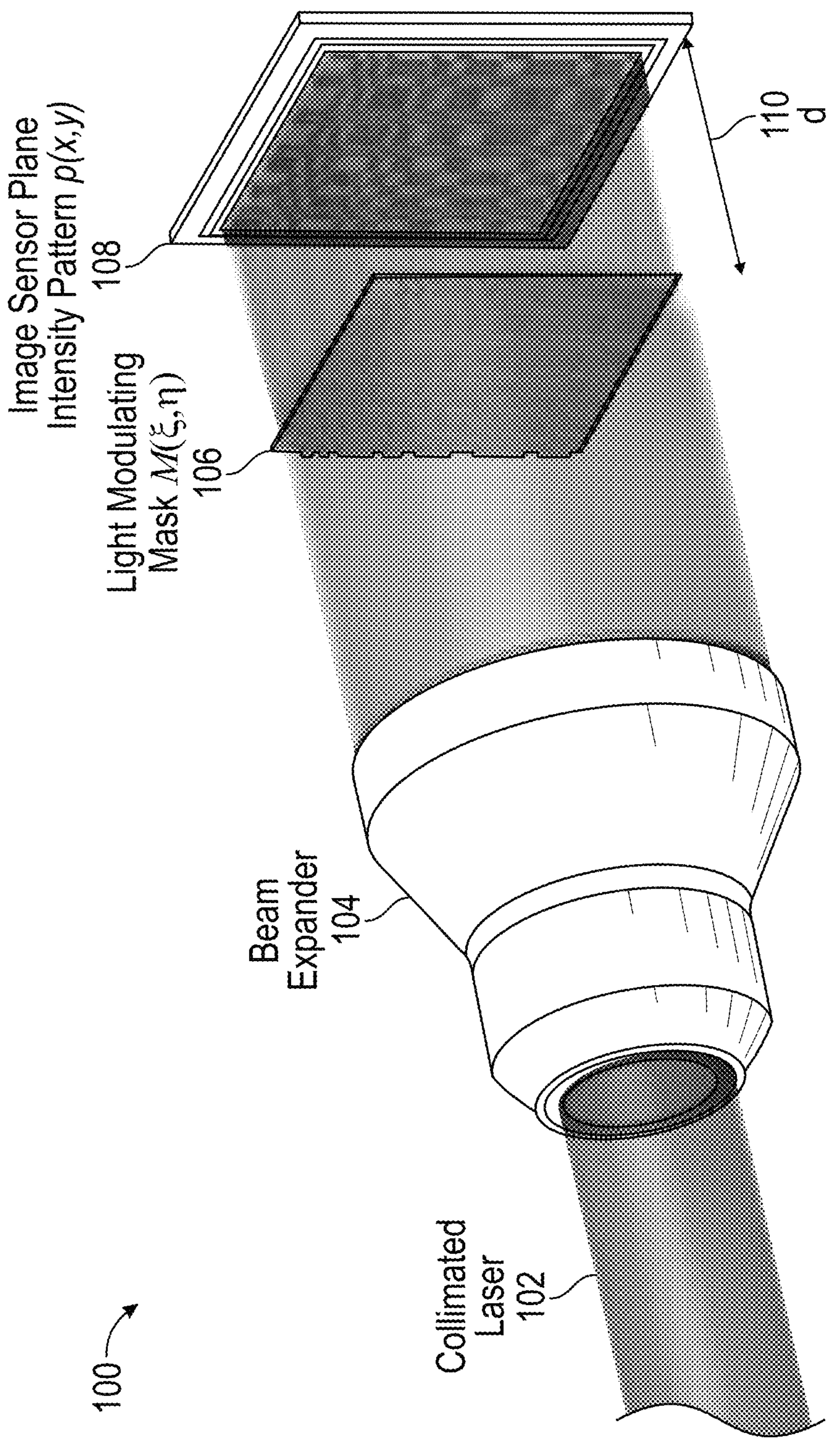
FIG. 1A shows system diagram in accordance with one or more embodiments of the invention.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (for example, first, second, third, etc.) may be used as an adjective for an element (i.e., any noun in the application). The use of ordinal numbers does not imply or create a particular ordering of the elements or limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-13, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a horizontal beam" includes reference to one or more of such beams.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that, one or more of the steps shown in the flowcharts may be omitted, repeated, and/or performed in a different order than the order shown. Accordingly, the scope of the invention should not be considered limited to the specific arrangement of steps shown in the flowcharts.

Although multiply dependent claims are not introduced, it would be apparent to one of ordinary skill that the subject matter of the dependent claims of one or more embodiments may be combined with other dependent claims.

In general, an aspect of the embodiments of the invention is directed to a technique that may design and optimize light-efficient diffractive optical elements for achieving high-resolution imaging as well as computer vision tasks constrained under design parameters such as thickness and applications. In particular, embodiments disclosed herein relate to a versatile thin lensless imaging device with a designed phase-mask placed at sub-2 mm from an imaging CMOS sensor. Using wave optics and phase retrieval methods, a general-purpose framework is used to create phase masks that achieve desired sharp point-spread-functions (PSFs) for desired camera thicknesses. From a single 2D encoded measurement, the reconstruction of high-resolution 2D images, computational refocusing, and 3D imaging are done. This ability is made possible by high-performance contour-based PSF. The heuristic contour-based PSF is designed using concepts in signal processing to achieve maximal information transfer to a bit-depth limited sensor. Due to the efficient coding, a person with ordinary skill in the art may use fast linear methods for high-quality image reconstructions and switch to iterative nonlinear methods for higher fidelity reconstructions and 3D imaging.

In other words, the objective is to design a framework to precisely realize high-performance PSFs. One or more embodiments introduce a flexible design framework that opens avenues for application specific lensless sensor design. In addition, the contour-based PSF and associated phase mask may achieve the highest resolution for imaging applications.

For single capture calibration, a coherent, collimated source is required. However, in lieu of a coherent, collimated source, an incoherent source may be used. Calibration across multiple devices with a single calibration step is restricted to devices which have identical (or nearly identical) mask patterns, same mask-to-sensor distance, and same imaging sensor pixel pitch. In practice, this means ensuring that the certain fabrication tolerances are met at the time of fabricating these devices.

Embodiments of the invention may be used in achieving highest possible resolution for lensless cameras setting the stage for ubiquitous use of lensless cameras commercially. For example, low-level feature extraction using the lensless camera may be passed through deep convolutional neural networks (CNNs or DCNNs) to perform various computer vision tasks. Additionally, the computer vision focused mask designs make possible low-power vision sensors that may be deployed for applications like IoT. The optimization algorithm for phase mask design may be used for creating other application specific lensless sensors.

In one or more embodiments, the key contributions are the following:

1. An optimization algorithm to generate phase masks (a.k.a. diffractive optical elements) for any device thickness and given point spread function (PSF).
2. An optimized contour-based point spread function that is efficient for imaging application and reaches the theoretical resolution limit for any given thickness constraint.
3. Phase mask design for extracting low-level vision features using edge detection or generic extraction filters like two-dimensional (2D) Gabor filters that can be used as a first layer of deep CNN for computer vision and artificial intelligence-based tasks.

4. Phase mask design for extracting task-specific features for computer vision and artificial intelligence-based applications such as face detection, object detection, pose estimation and many others.

FIG. 1A illustrates a schematic overview of a system of a lensless camera ("lensless imaging device") (100) generating an intensity pattern at an image sensor in accordance with one or more embodiments. In particular, the system (100) includes a collimated laser (102), a beam expander (104), and a light modulating mask ("masks") (106). The system (100) further includes an image sensor plane intensity pattern ("imaging sensor") (108) placed at a close distance d (110) from the light modulating mask (106). The efficacy of lensless imaging systems hinges on some foreknowledge of how light appears when it reaches the imaging sensor.

Figure 1B:
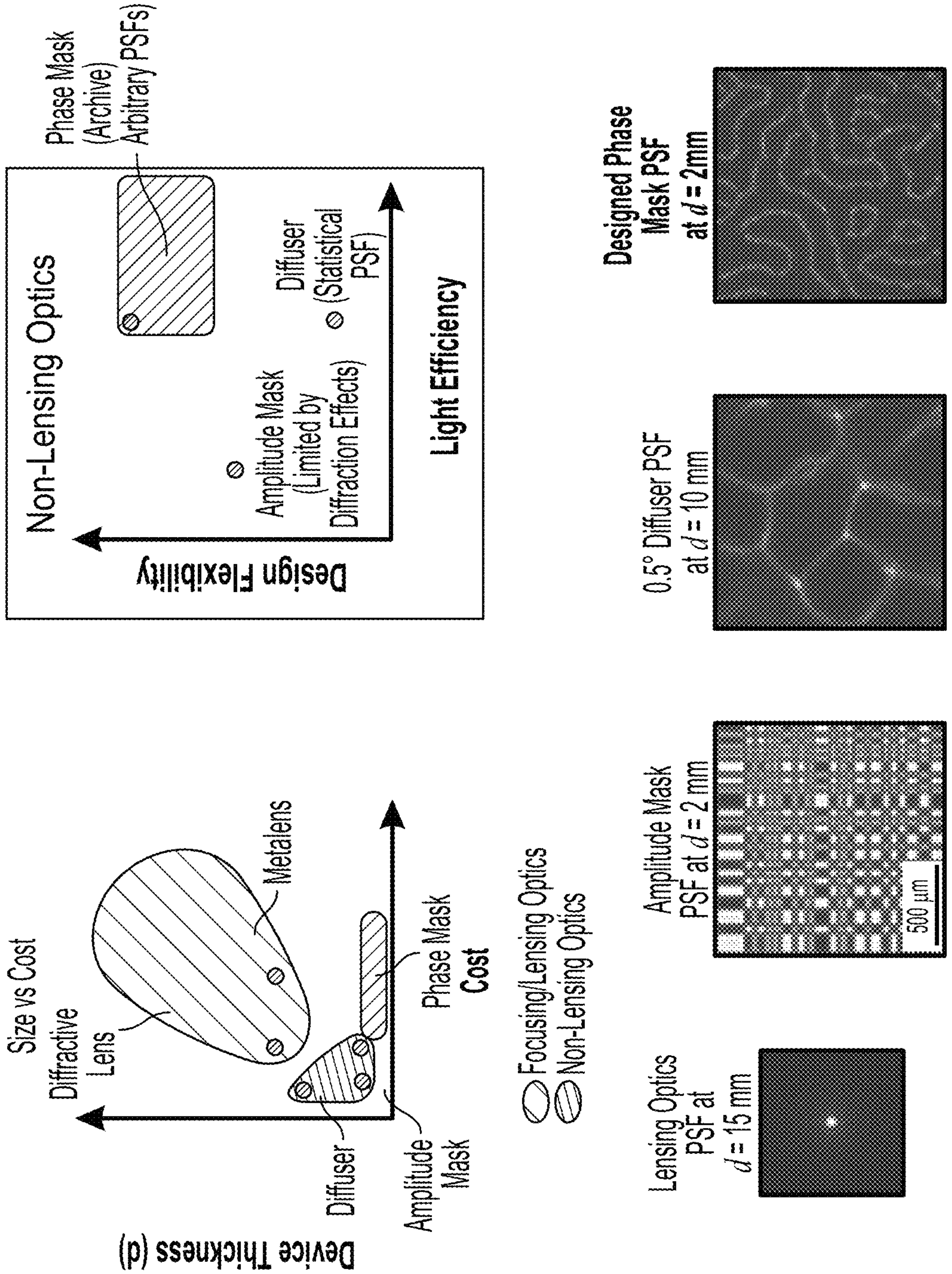
FIG. 1B shows diagrams in accordance with one or more embodiments of the invention.
Figure 2:
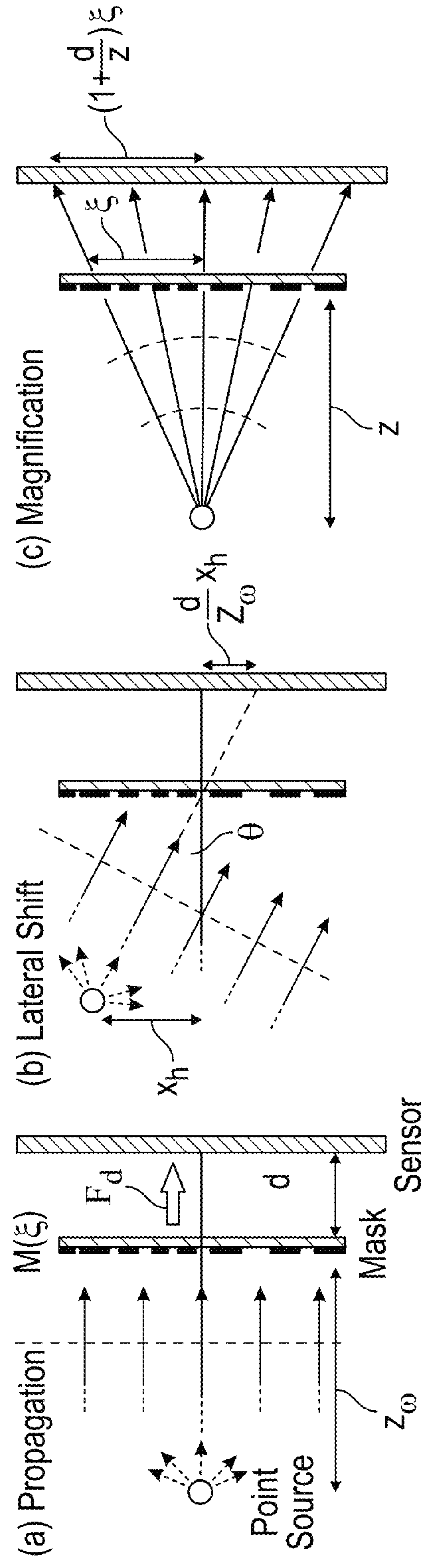
FIG. 2 shows diagrams of forward propagation in accordance with one or more embodiments of the invention.

In one or more embodiments, the lensless camera consists of an encoding element or the light modulating mask (106) placed at a close distance d (110) from the imaging sensor (108). Various masks (106) may be considered, for example, amplitude masks, phase gratings, and diffuser. Amplitude masks are designed to produce binary PSFs, phase gratings are designed to produce robust nulls, and diffusers are used for its pseudorandom caustic pattern. However, each of these masks is limited in their designability as shown in FIG. 1B. The difference in amplitude mask pattern and the generated PSF can be seen in FIG. 1B. In particular, top of FIG. 1B shows non-lensing optics provides a way to achieve thin devices at low-cost. Among the various non-lensing optics, phase masks are versatile in their designs and may produce a larger space of PSF. In addition, bottom of FIG. 1B shows PSFs from various optics. Lensing optics have a small PSF support while non-lensing optics display large PSFs. The PSFs of the non-lensing optics are experimentally captured.

While the design of amplitude masks is straightforward, there are two inherent issues: (1) they block a significant amount of light, and (2) diffraction effects cause the PSF to deviate from the original design. On the other extreme, diffusers are inherently statistical while having a minimal light loss. The statistical nature puts the diffuser low on the design flexibility scale.

In one or more embodiments disclosed herein the phase masks have been used as optical masks (masks (106)). Among the various diffraction masks, the phase masks have proven to be versatile in realizing a variety of PSFs with and without the assistance of lenses. Additionally, the phase masks are highly light-efficient and hence operationally better suited for a range of illumination scenarios. In particular, the phase mask modulates the phase of incident light by the principles of wave optics. In addition, the phase masks allow most of the light to pass through, providing high signal-to-noise-ratio (SNR). Hence, the phase masks are desirable for low light scenarios and photon-limited imaging. In some embodiments, the phase mask has been used in the lensless camera (100) along with a mask design algorithm to achieve desirable PSFs. The designability of the phase masks allows realization of high performance PSFs and hence improve the overall performance of the lensless imaging device (100).

To completely characterize the lensless camera (100), a person with ordinary skill in the art may require knowing the following:

1. Mask pattern,
2. Location of mask with respect to the sensor,
3. Transform that computes the response of the sensor given a location of point source.

The mask pattern is generally predetermined and is used for the fabrication of the mask. The transform that computes the response of the imaging sensor given the mask pattern and the location of point source and computation of the precise mask location with respect to the imaging sensor are described in detail in following paragraphs.

Imaging Architecture

As discussed above, the lensless camera (100) has a fabricated diffractive element called the phase mask placed at a distance d from the imaging sensor. The phase mask modulates the phase of incident light and produces a pattern at the sensor through constructive and destructive interference. In the following paragraphs, how the phase mask produces interference pattern and the consequent diffractive imaging model are described.

A) Propagation Transform

When the mask (106) M(ξ,n), is illuminated with a coherent, collimated light, the intensity pattern p(x,y) captured by the imaging sensor (108) placed at the distance d (110) is given by magnitude square of Fresnel propagation:

$$\begin{aligned} p(x, y) &= |\mathcal{F}_{d,\lambda}(M(\xi, \eta))|^2 \\ &= \left| \frac{1}{j\lambda d} \int\int M(\xi, \eta) \exp\left[ j\frac{\pi}{\lambda a}\left((x-\xi)^2 + (y-\eta)^2\right)\right] d\xi d\eta \right|^2 \end{aligned} \tag{1}$$

where $F_{d,\lambda}(\bullet)$ denotes Fresnel propagation by distance d and λ is the wavelength of light. For simplicity, consider a one-dimensional (1D) mask M(ξ) and drop the scaling term. Then, the pattern produced from collimated light parallel to optical axis is given by $$\begin{aligned} p(x) &= \left| \int M(\xi) \exp\left[ j\frac{\pi}{\lambda d}(x-\xi)^2 \right] d\xi \right|^2 \\ &= \left| \int M(\xi) \exp\left[ j\frac{\pi}{\lambda d}(\xi^2 - 2x\xi) \right] d\xi \right|^2 \end{aligned} \tag{2}$$

where the quadratic terms are expanded and a constant phase term is removed since only intensity is considered.

The collimated light or planar waves is generated from an on-axis point source at a sufficiently large distance from the mask. Then, p(x) (or p(x,y) for 2D) can be called as the PSF of the system.

If the point source is off-axis, illuminating the phase mask at an angle θ, it imparts a linear phase $$e^{j\frac{2\pi}{\lambda}sin\theta}$$

to equation (2) and the resultant intensity pattern is $$\begin{aligned} I_\theta(x) &= \left| \int e^{j\frac{2\pi}{\lambda}sin\theta} M(\xi) \exp\left[ j\frac{\pi}{\lambda d}(\xi^2 - 2x\xi) \right] d\xi \right|^2 \\ &= \left| \int M(\xi) \exp\left[ j\frac{\pi}{\lambda d}(\xi^2 - 2(x - d\sin\theta)\xi) \right] d\xi \right|^2 \\ &= p(x - d\sin\theta) \end{aligned} \tag{3}$$

Hence, an off-axis point source causes a lateral shift of the PSF. If the point source is at a distance $z_\infty$ and height $x_h$ then by paraxial approximation $$\delta_{z_\infty}(x - x_h) \rightarrow p\left(x - \frac{d}{z_\infty}x_h\right) \tag{4}$$

where $\delta_z(x)$ denotes point source at distance z from the mask. The shift property is shown in "lateral shift" of an illustration (200) in FIG. 2. This property is called shift invariance or "memory effect" used to perform non-invasive imaging through scattering media and wavefront sensing and is stated as "a lateral shift of point source causes translation of PSF on the sensor plane."

For a point source at a finite distance z from the mask, it imparts an additional quadratic phase $$e^{j\frac{\pi}{\lambda z}\xi^2}$$

to equation (2) to give an intensity response as:

$$\begin{aligned} I_Z(x) &= \left|\int e^{j\frac{\pi}{\lambda z}\xi^2} M(\xi)\exp\left[j\frac{\pi}{\lambda d}(\xi^2 - 2x\xi)\right]d\xi\right|^2 \\ &= \left|\int M(\xi)\exp\left[j\frac{\pi}{\lambda}\left(\frac{1}{d}+\frac{1}{z}\right)\left(\xi^2 - 2\frac{x}{1+d/z}\xi\right)\right]d\xi\right|^2 \\ &\approx \left|\int M(\xi)\exp\left[j\frac{\pi}{\lambda d}\left(\xi^2 - 2\frac{x}{1+d/z}\xi\right)\right]d\xi\right|^2 \\ &= p\left(\frac{x}{1+d/z}\right) \end{aligned} \tag{5}$$

Here, it is assumed that d<<z. Therefore, following the same notations as equation (3), $$\delta_z(x) \rightarrow p_z(x) = p\left(\frac{x}{1+d/z}\right) \tag{6}$$

which is a geometrical magnification of the PSF. The magnification property is shown in "magnification" of the illustration (200) in FIG. 2 and may be exploited for 3D imaging. This property is stated as "an axial shift of point source causes magnification of PSF on the sensor plane."

Broadband transform: The propagation transform given in equation (1) is defined for a monochromatic light source of wavelength λ. Most imaging sensors accept a broad spectrum of light. For imaging sensors with color filters (e.g., red, green, and blue filters), the filtered response of the sensor may be incorporated and may be generalized to any filtered or monochrome sensor. For example, the propagation transform for a RGB camera may be defined as follows:

$$p_c(x, y) = \sum\nolimits_{k=1}^{N_c} w_k^c \left|\mathcal{F}_{d,\lambda_k^c}(M(\xi, \eta))\right|^2, c = \{\text{red, green, blue}\} \tag{7}$$

where $$\lambda_k^c$$

are k discretized wavelengths within broadband response of the imaging sensor for color channels c={red, green, blue} and $$w_k^c$$

are weights for each wavelength according to sensitivity of the imaging sensor.

Figure 3:
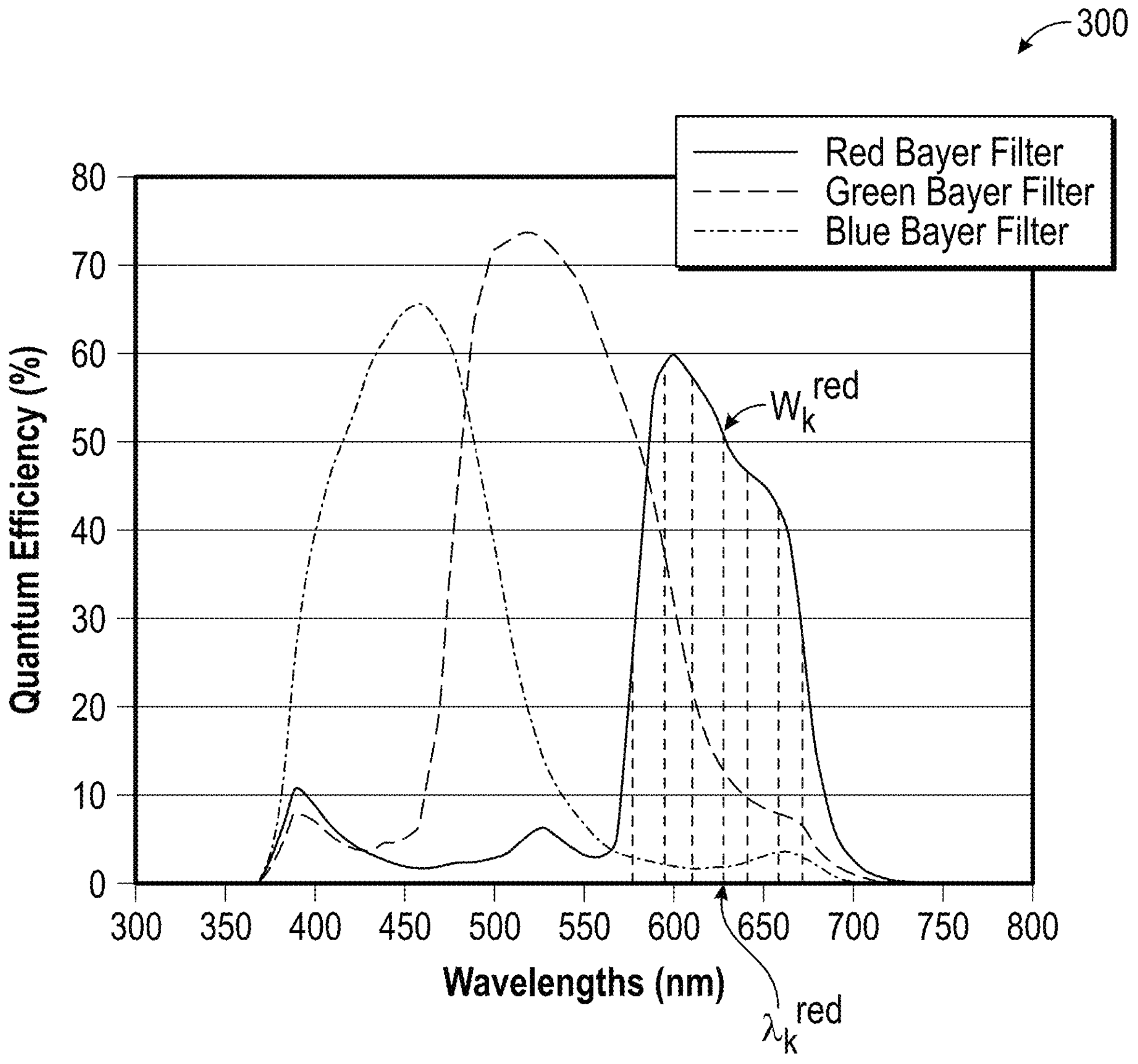
FIG. 3 shows a plot illustrating Bayer sensor response in accordance with one or more embodiments of the invention.

Color filter response of a typical imaging sensor, example sampled wavelengths $$\lambda_k^{red}$$

and weights $$w_k^{red}$$

for the rea channel are illustrated in FIG. 3 as plot (300). Properties given by equations (3) and (5) may hold for broadband PSF $p_c(x,y)$ as well.

B) Precise Mask Location

Single Capture for Precise Mask Location: With access to a monochromatic source like a laser (or a partially coherent source like narrowband LEDs), a precisely location of the mask (106) with respect to the imaging sensor (108) using single capture and phase retrieval algorithms may be determined. In one or more embodiments, the lensless camera (100) with the laser (102) (or narrowband LED) are set as shown in FIG. 1A and a single intensity pattern p(x,y) is captured. If the field at the imaging sensor plane (108) is captured, then the mask pattern may be computed using back Fresnel propagation $F_{-d,\lambda}(\bullet)$. However, regular imaging sensors may capture only the squared magnitude, a.k.a. intensity, of the field. Therefore, to recover the mask pattern iterative phase retrieval algorithms and, in particular, an approach similar to Gerchberg-Saxton (GS) are used. In one or more embodiments, the phase retrieval algorithm adopted for lensless camera replaces the Fourier transforms of the GS algorithm with near-field Fresnel diffraction (has an additional quadratic phase) and thus is termed as Near-field Phase Retrieval (NfPR), as shown FIG. 4B. The NfPR does not guarantee a unique solution. However, embodiments disclosed herein require a phase mask that may produce the target PSF and not the unique phase mask profile.

The iterative NfPR may definitely converge due to strong constraints on the mask: (a) binary amplitude constraint for binary amplitude mask, and (b) unity amplitude for phase mask. An iterative approach or NfPR (400) is summarized in FIG. 4A. The phase retrieval method NfPR may provide both the mask pattern and the precise alignment of mask with the sensor. The phase retrieval method NfPR is discussed in detail along with description on designing of phase mask.

Figure 4A:
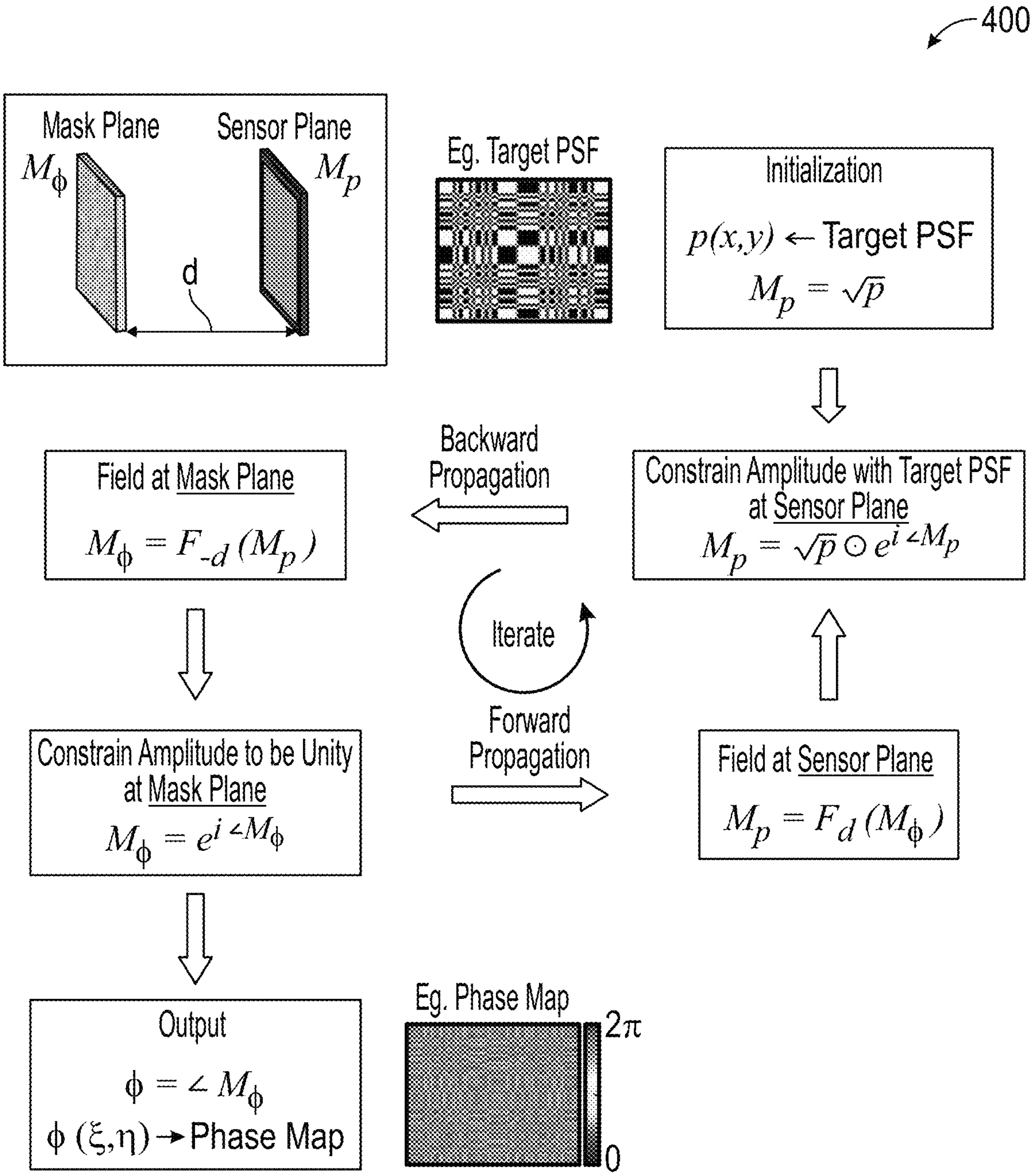
FIG. 4A shows an algorithm for mask pattern retrieval in accordance with one or more embodiments of the invention.
Figure 4B:
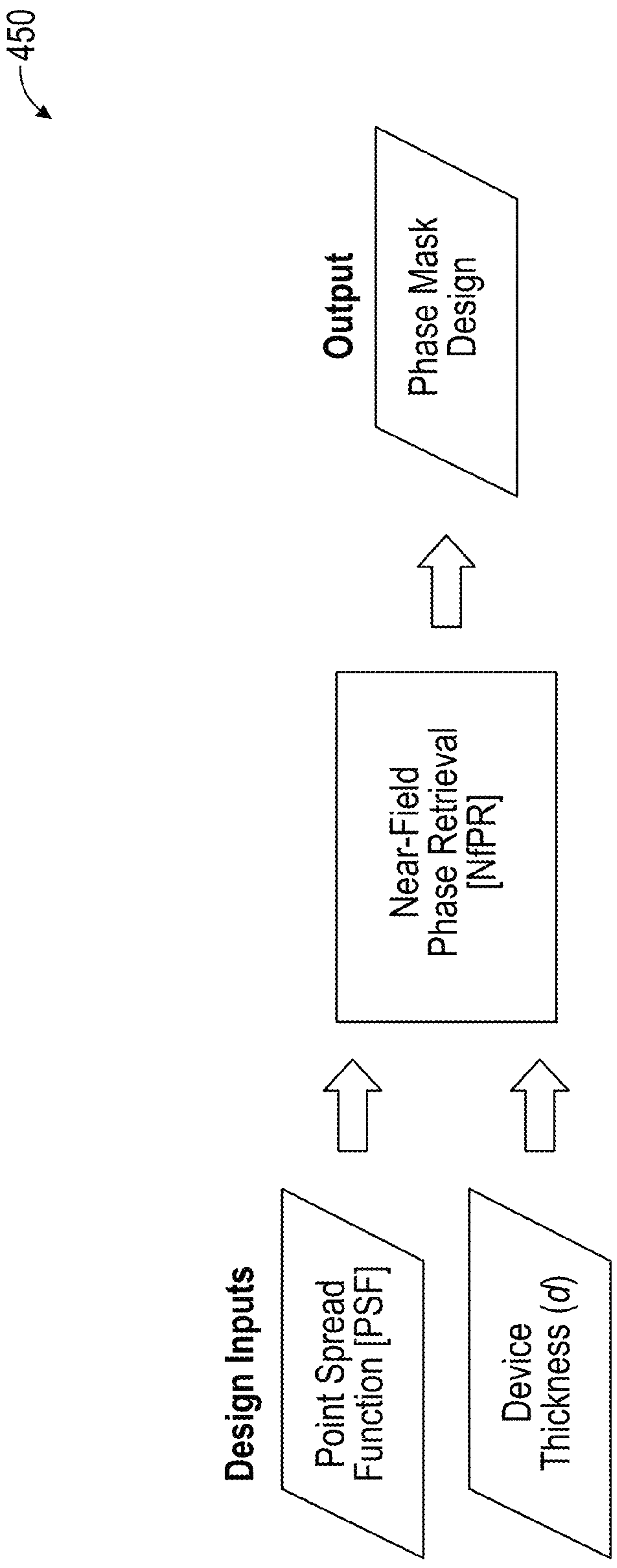
FIG. 4B shows a schematic overview of end-to-end architecture framework of a system in accordance with one or more embodiments of the invention.

In some embodiments, when the mask is larger in size than the sensor, the mask pattern obtained may be a subsection of the entire mask pattern. Since the full mask pattern is predetermined, the full mask from the location of the subsection may be precisely located. With the knowledge of mask pattern, location of mask, and the forward transform, the response of the lensless camera (100) for a point source may be computed at any location using equations (1) and (3)-(6). FIG. 4B shows a phase mask framework (450) in accordance to one or more embodiment of the invention. In particular, the phase mask framework (450) takes the input of target PSF and the desired device geometry and outputs an optimized phase mask design.

Figure 4C:
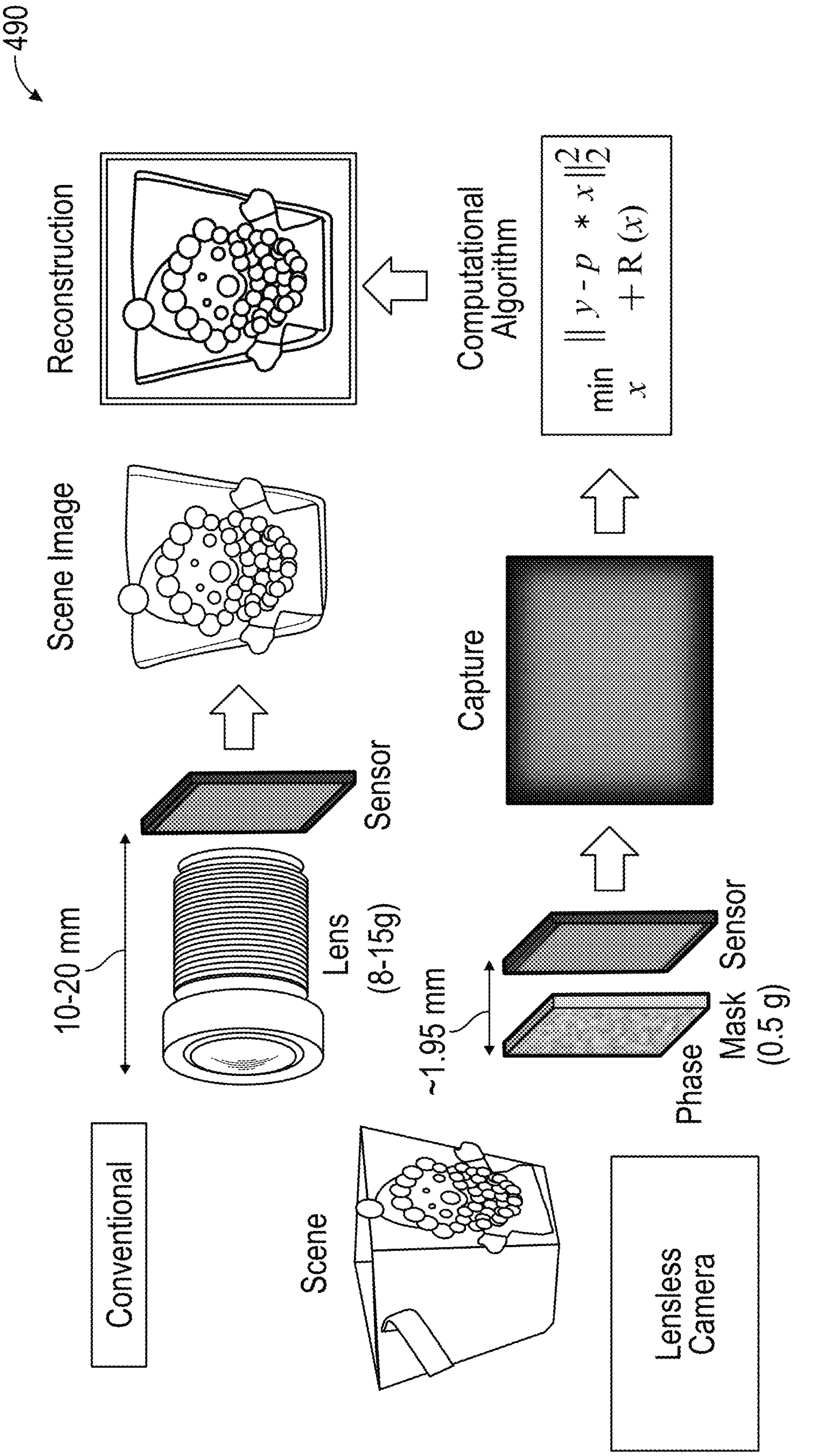
FIG. 4C shows a schematic overview of comparison of imaging using a conventional camera and a lensless camera in accordance with one or more embodiments of the invention.
Figure 5:
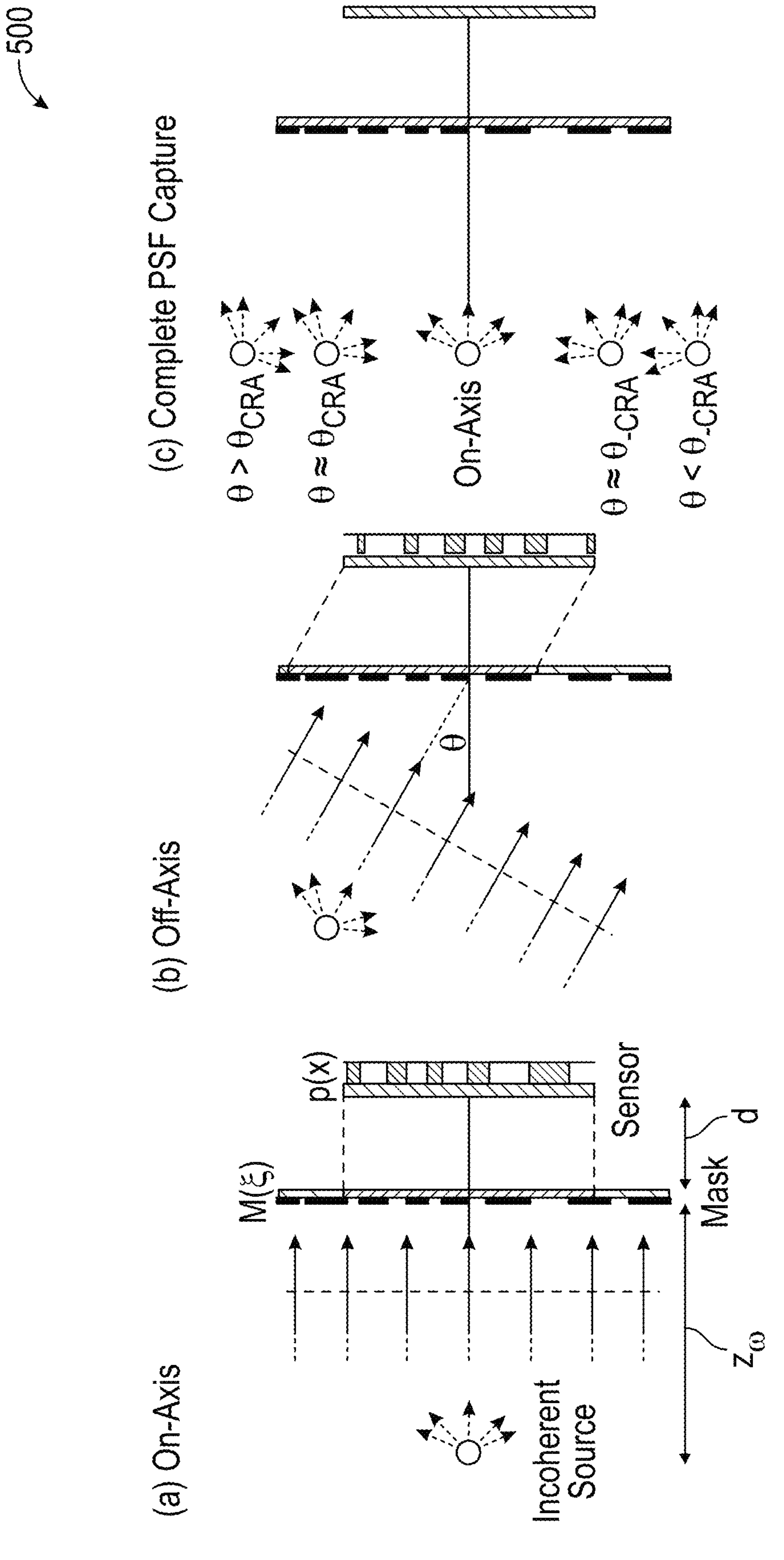
FIG. 5 shows illustration of calibration with incoherent point source in accordance with one or more embodiments of the invention.
Figure 6:
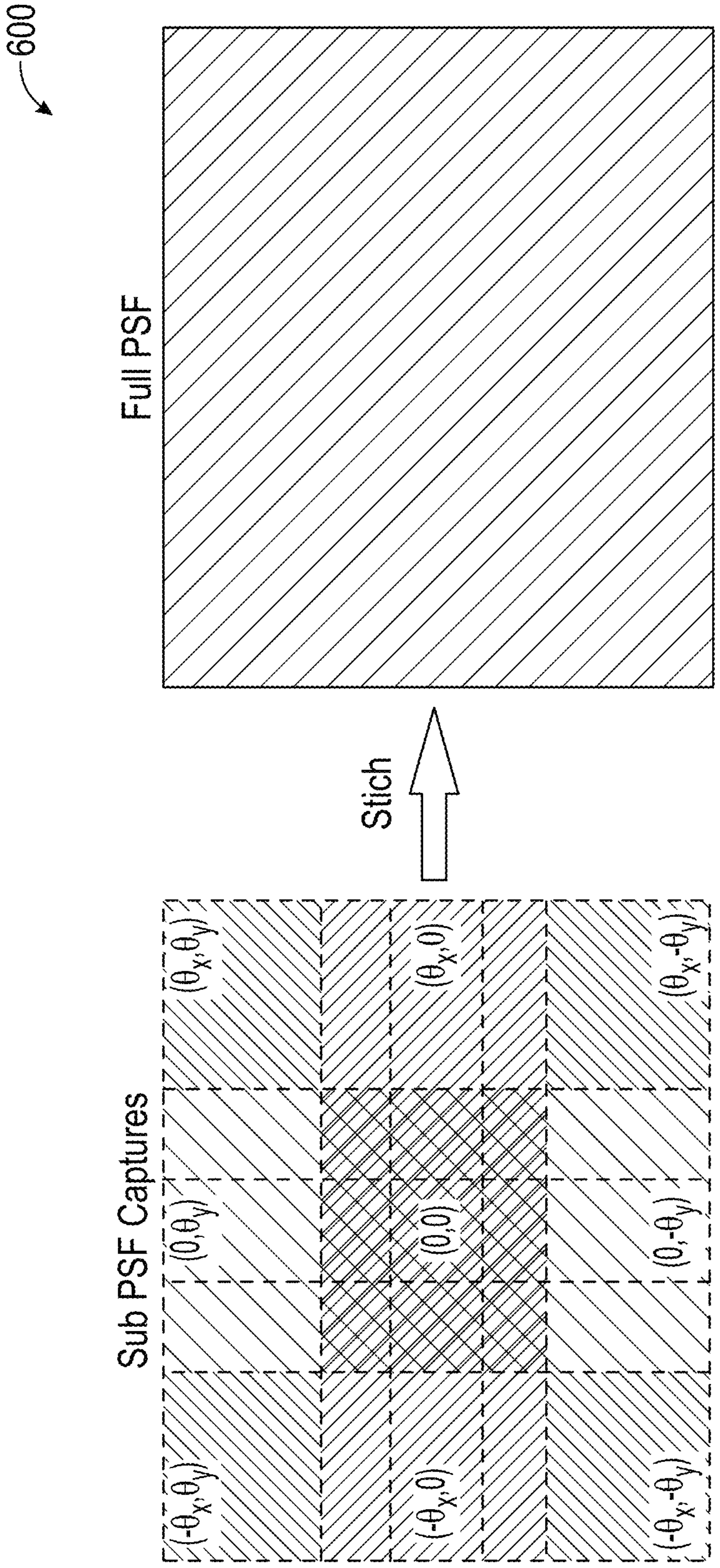
FIG. 6 shows illustration of stitching sub PSFs into a full PSF in accordance with one or more embodiments of the invention.

FIG. 4C a schematic overview (490) of comparison of imaging using a conventional camera and a lensless camera in accordance with one or more embodiments of the invention. In particular, the lensless camera is 5-10× thinner and may reconstruct high-fidelity images from multiplexed measurements. Additionally, the lensless camera may function in more ways than conventional camera. Specifically, the lensless camera may produce 2D images for any scene distance, refocused images at medium distance, and 3D imaging at close distance.

Incoherent Source Capture for Precise Mask Location: Although using a monochromatic or narrowband, the collimated laser (102) ("light source") simplifies locating the mask (106), access to such sources could be difficult or not possible in some scenarios. For such cases, the lensless camera (100) may be characterized using simple broadband point light source like a white LED with only a few additional steps. In some embodiments, instead of finding the precise location of the mask, the complete PSF with multiple captures may be constructed. In some alternate embodiments, the mask may be larger in size compared to the sensor and require constructing the PSF as though the sensor is as large as the mask.

Since the sensor is smaller than the mask, the pattern captured on the imaging sensor (108) for any point source location may have information of a subsection of the mask. In order to capture the effect of the entire mask, multiple sensors capture for point sources located at locations is performed as shown in an illustration (500) in FIG. 5. Then, the sub-PSFs are stitched together using the overlaps between them to construct the complete PSF as shown in an example (600) in FIG. 6. If a broadband white LED is used as the point source, the broadband is directly constructed and with properties given by equations (3)-(5), the response of the lensless camera (100) is computed for a point source at any location.

Multi-Device Single Calibration

Having learned the precise location of mask (106) and constructed the transfer matrices for a single device, these transfer matrices may be utilized for any other lensless devices with the same (or very similar) mask pattern, same mask distance from the imaging sensor (108), and using the same sensor pixel pitch. In other words, transfer matrices may also be constructed in a similar manner based on other properties of the PSF (e.g., n-separable, symmetry, convolutional). These transfer matrices are robust to spatial translation of the mask in relation to the imaging sensor in that this may only result in a spatial translation of the captured image.

By ensuring the precision mask placement with respect to the sensor may lead to identical image captures and reconstruction (barring aberrations from fabrication). Additionally, if the mask (106) cannot be precisely placed with respect to the imaging sensor (108), the image can be simply shifted computationally for identical image reconstruction (if desired). This multiple device calibration via a single calibration step opens up the possibility for mass production and commercialization.

In some embodiments, the lensless camera (100) design may be broadly categorized into two steps:

1. Point spread function (PSF) engineering that is application specific.
2. Phase mask optimization given the point spread function.

The performance of the lensless camera (100) relies on the PSF, while the phase mask optimization makes the PSF realizable.

1) PSF Engineering: In some embodiments, a lensless camera encodes an image onto the imaging sensor by convolution of the scene with the PSF. From the convolution theorem, for maximal information transfer, large and almost flat magnitude spectrum is desirable in the PSF. Another way to look at this is that the deconvolution of PSF involves the inversion of frequency spectrum of the PSF, and low values of the magnitude spectrum may lead to amplification of noise at those frequencies.

Imaging sensors capture light intensity, which implies that the values in the PSF are always positive. A positive PSF may have a larger contribution at DC or the zero-frequency component compared to other frequencies. Hence, efforts need to be taken to minimize the DC component. Additionally, image sensors do not have infinite precision and are usually limited to 8- to 12-bit precision. These two factors also need to be considered when designing the PSF in one or more embodiments.

Designing the PSF could, potentially, be achieved using many methods such as optimizing over a theoretical metric or using a data-driven approach. In some embodiments, a heuristic approach based on the domain knowledge of signal processing is considered. The desired characteristics of the PSF and the corresponding reasoning as follows:

- Contain all directional filters to capture textural frequencies at all angles.
- Spatially sparse to minimize the DC component of PSF's Fourier transform.
- High contrast (i.e., binary) to compensate for a limited bit depth of sensor pixels.
- Large regions of contiguous zero intensity to further compensate for a limited bit depth of sensor pixels.

Figure 7A:
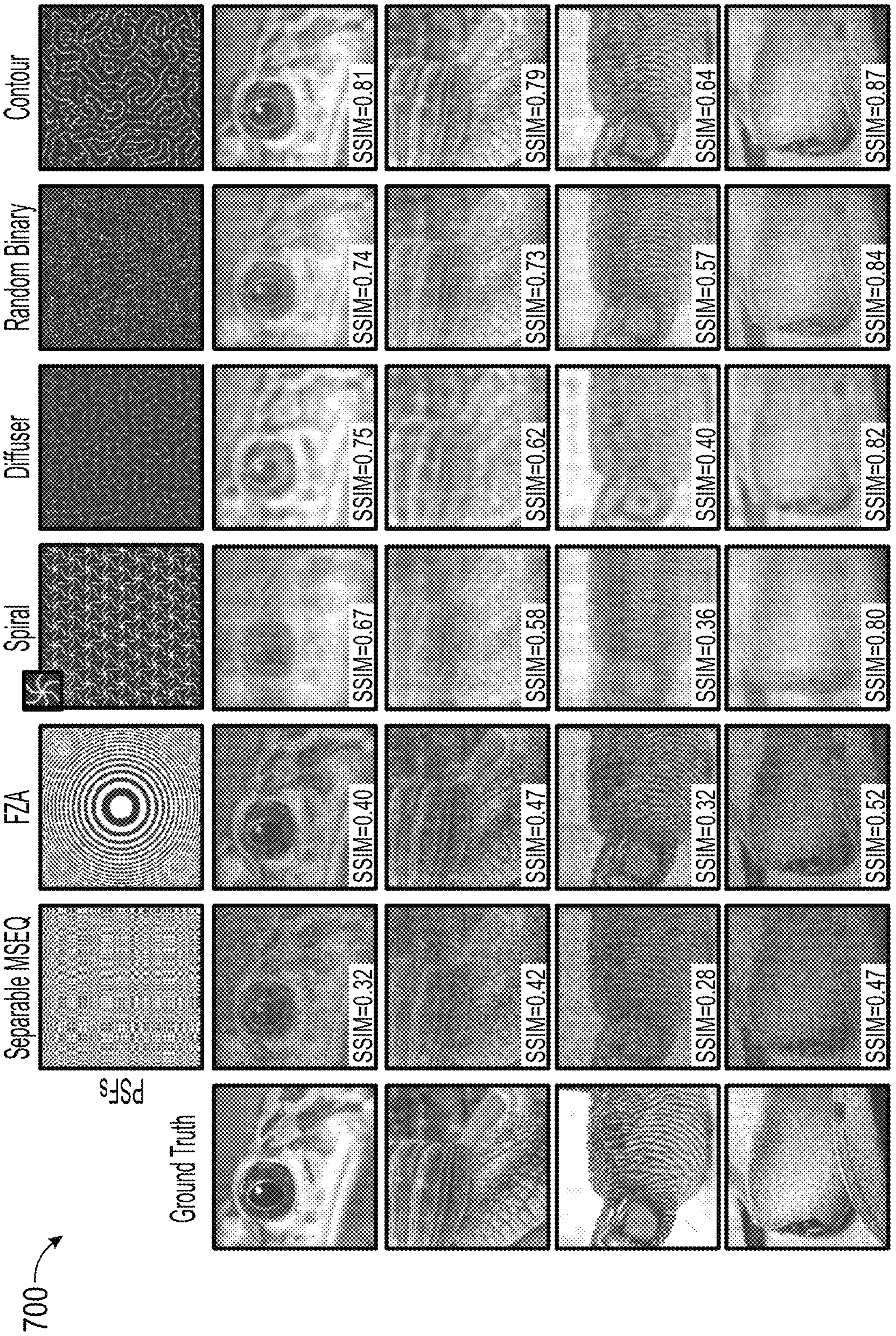
FIGS. 7A-7C show diagrams in accordance with one or more embodiments of the invention.

Various PSFs have been used for lensless imaging for their attractive properties. For example:

Separable PSF: A separable PSF is constructed by an outer product of two 1-D vectors. Such construction simplifies the imaging model as convolution along the rows of the image followed by convolution along the columns. In matrix form, this operation may be written as a product of 2-D image with a few small 2-D matrices. An example of separable PSF is shown in FIG. 7A, constructed from outer product of two maximum length sequences.

Fresnel Zone Aperture: A Fresnel Zone Aperture (FZA) PSF is constructed like a Fresnel zone plate. Multiplying the imaging sensor capture with a virtual FZA results in overlapping moiré fringes. Fast reconstruction is done by applying a 2-D Fourier transform on the moiré fringes. An example of FZA PSF is shown in FIG. 7A.

Spiral PSF: A spiral PSF is used to cover a large sensor area. An example of a tessellated spiral PSF is shown in FIG. 7A. A single unit of the tessellation is shown on the top left corner.

Contour-based PSF: In one or more embodiments, contour lines with sufficient random orientation satisfies all the criterions mentioned above, as shown in FIG. 7B. There are, however, many possible ways to generate contour PSFs. In some embodiments, contours are chosen to be produced from a two-dimensional procedural noise called a Perlin noise due to guaranteed randomness and the ability to control the sparsity.

The contour-based PSF is engineered for imaging applications in embodiments disclosed herein and may be created using following steps:

1. Any graphics-based landscape profile generator. In one or more embodiments, a Perlin Noise is used.
2. Any edge detection algorithm performed on the landscape profile. In some embodiments, canny edge-detection is used.

Figure 7B:
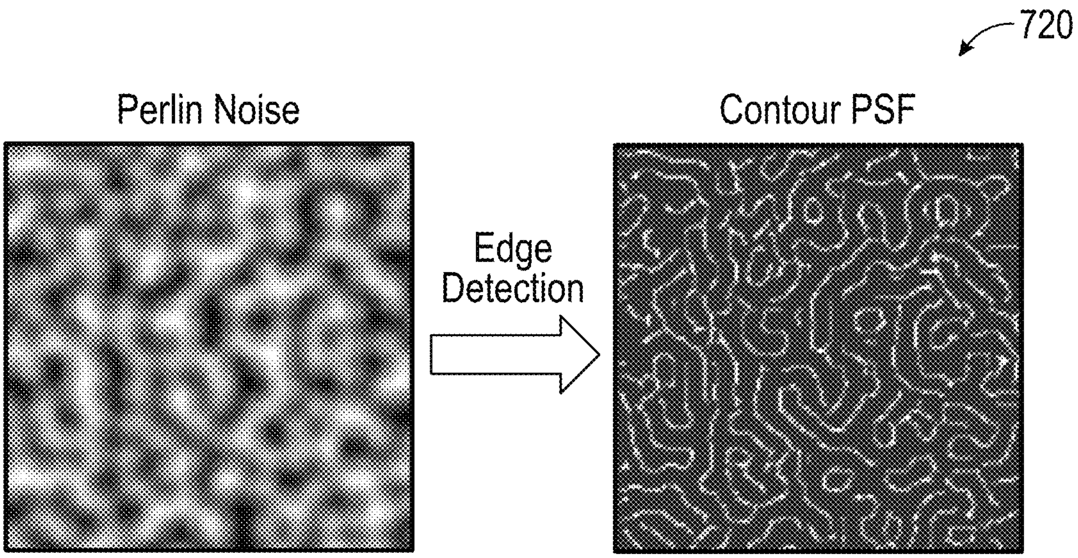

In graphics, Perlin noise is a popular tool to produce random landscape textures. The boundary contours of such landscape textures may invariably (a) contain a set of randomly oriented curves that may function as directional filters, (b) be sparse, (c) be binary, and (d) contain large empty regions. To produce the contour PSF, a canny edge detection is applied to a generated Perlin noise. Such generation of PSF is a good candidate for lensless imaging and satisfy the above mentioned characteristics. Illustration of generating a contour PSF (720) is shown in FIG. 7B.

Figure 7C:
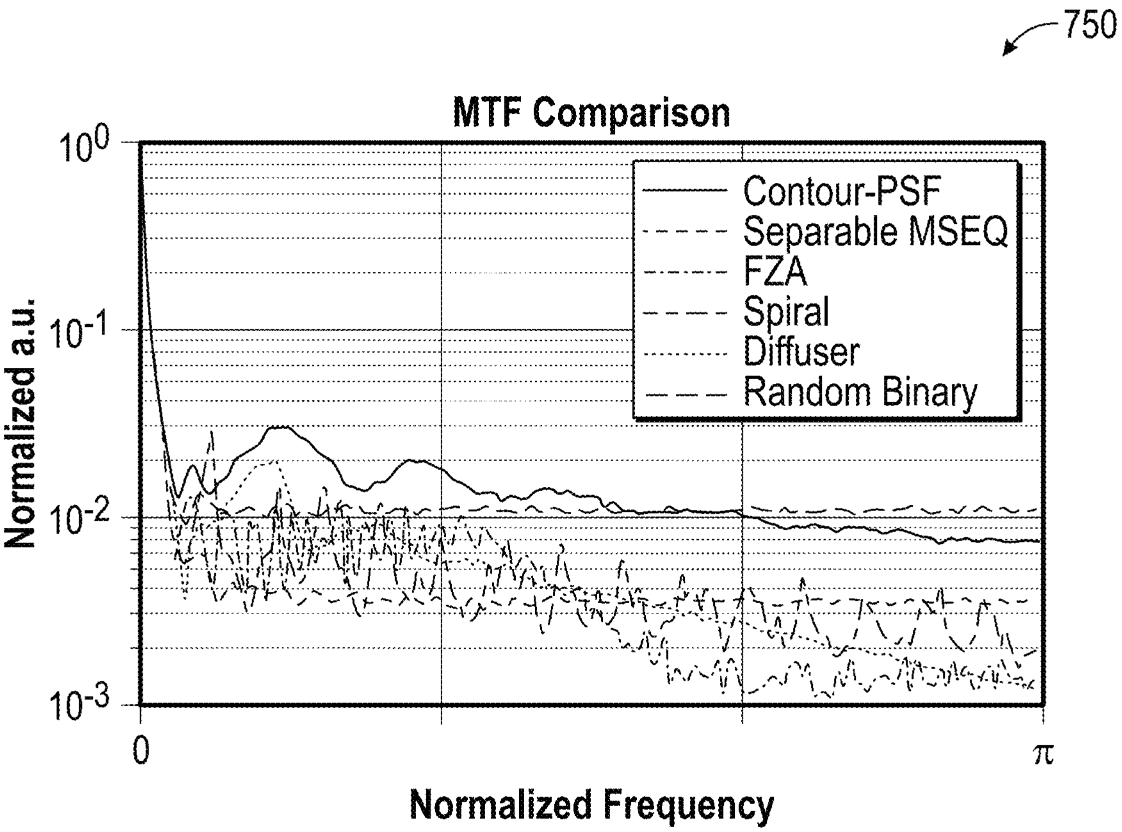

One or more embodiments disclosed herein are based on the high-performance contour PSF that provides the ability to perform high-resolution (a) 2D imaging, (b) re-focusing, and (c) 3D imaging at different depth ranges. FIG. 7A shows a simulated reconstruction (700) with the separable PSF, the FZA PSF, the spiral PSF, a diffuser PSF, a random binary PSF, and the contour PSF in accordance with one or more embodiments of the invention. As seen from FIG. 7A, the contour PSF consistently produces better results. FIG. 7C shows a plot (750) illustrating analysis of magnitude spectrum of various lensless PSFs in accordance with one or more embodiments of the invention: separable MSEQ, FZA, tessellated spiral, diffuser, random binary, and contour PSFs. In some embodiments, the magnitude spectrum of the contour PSF remains large for entire frequency range indicating better invertibility characteristics. The high performance of the contour-based PSF is validated using the modulation transfer function (MTF) metric in FIG. 7C.

2) Phase mask Design: In some embodiments, the goal is to optimize a phase mask design that produces the target PSF at the target device thickness d (the distance between the imaging sensor and mask). A thing to note is that the phase mask performs a complex-valued modulation of light wavefront while the target PSF is a real-valued intensity distribution. Hence, obtaining phase-mask profile from the PSF is an undetermined problem. However, as discussed above, computational method NfPR has been adopted in one or more embodiments, shown in FIGS. 4A and 4B, that tries to solve this precise problem of computing complex-valued fields from real-valued intensities.

Figure 8A:
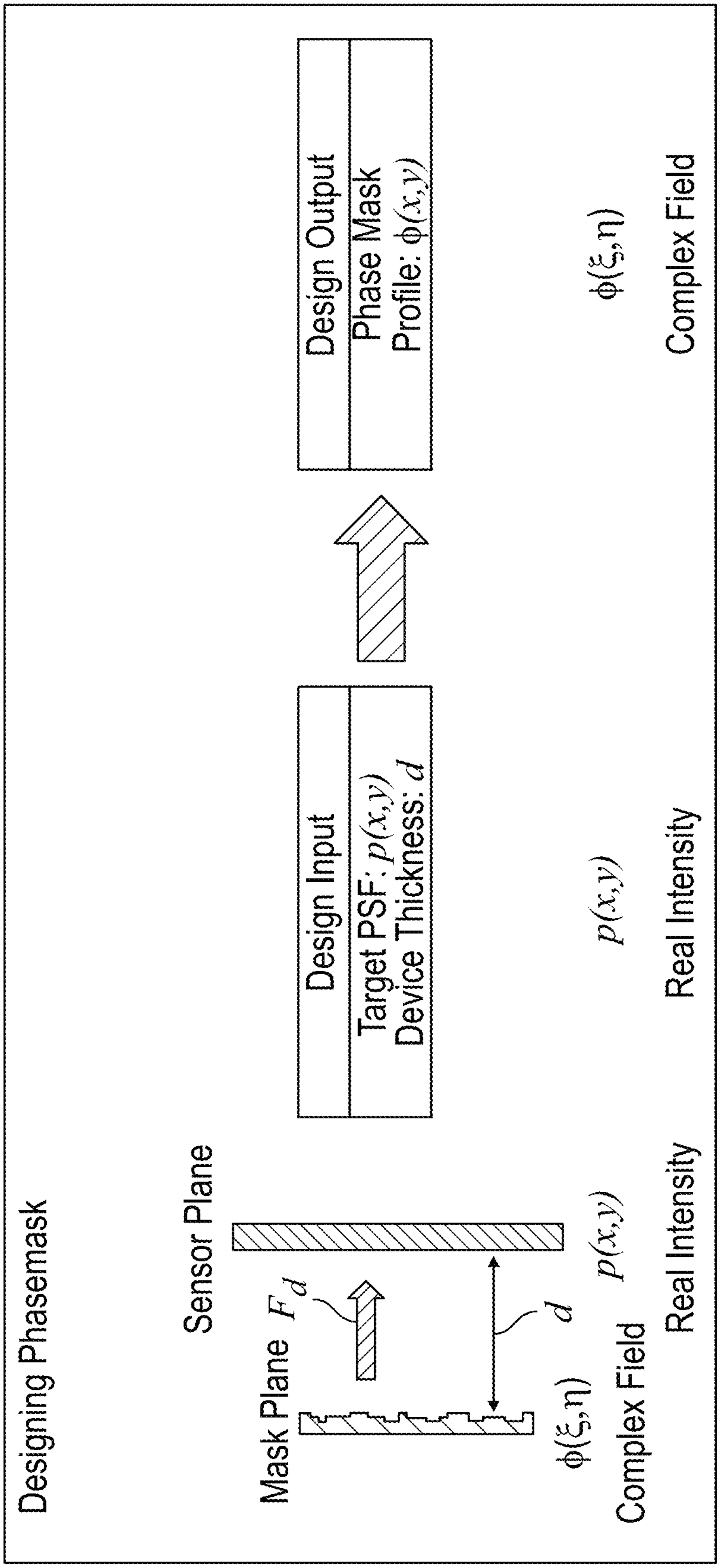
FIG. 8A shows a schematic overview of phase mask design framework in accordance with one or more embodiments of the invention.

The NfPR for phase mask optimization can be described as follows. The algorithm uses an iterative approach, iterating between the fields at the mask plane and the sensor plane while simultaneously enforcing constraints at the two planes—the amplitude of the field at the mask plane is unity and intensity of the field at the sensor plane is the target engineered PSF. Forward Fresnel propagation is used to go from the mask plane to the imaging sensor plane, while backward Fresnel propagation (by negating the distance in equation (1)) is used to go from the imaging sensor plane to the mask plane. The iterative algorithm is summarized in FIG. 4A. The phase mask optimization requires the following inputs: the target PSF, mask to imaging sensor distance, and wavelength of light. The wavelength of light is chosen to be the mid visible wavelength of 532 nm. FIG. 8A shows a schematic overview (800) of phase mask design framework in accordance with one or more embodiments of the invention.

The phase mask optimization is wavelength specific and measuring the PSF far from the design wavelength may yield poor performance. The chosen green wavelength (532 nm) lies in the middle of the color spectrum and may give reasonable color performance. However, this may be marginally overcome using multi-wavelength phase mask optimization but might not be able to solve the issue completely due to phase mask following scalar diffraction theory. In some embodiments, metamaterials may be used for fabrication as the metamaterials can function under vector diffraction theory and may potentially solve the wavelength sensitivity issue.

Phase Mask Height Map: physically implement the phase-mask, the phase profile needs to be transformed into the height map of the final mask substrate. Assuming n as the refractive index of the mask substrate, the height map is given by:

$$h(x, y) = \frac{\lambda}{2\pi(n-1)}\phi(x, y) \tag{8}$$

Figure 8B:
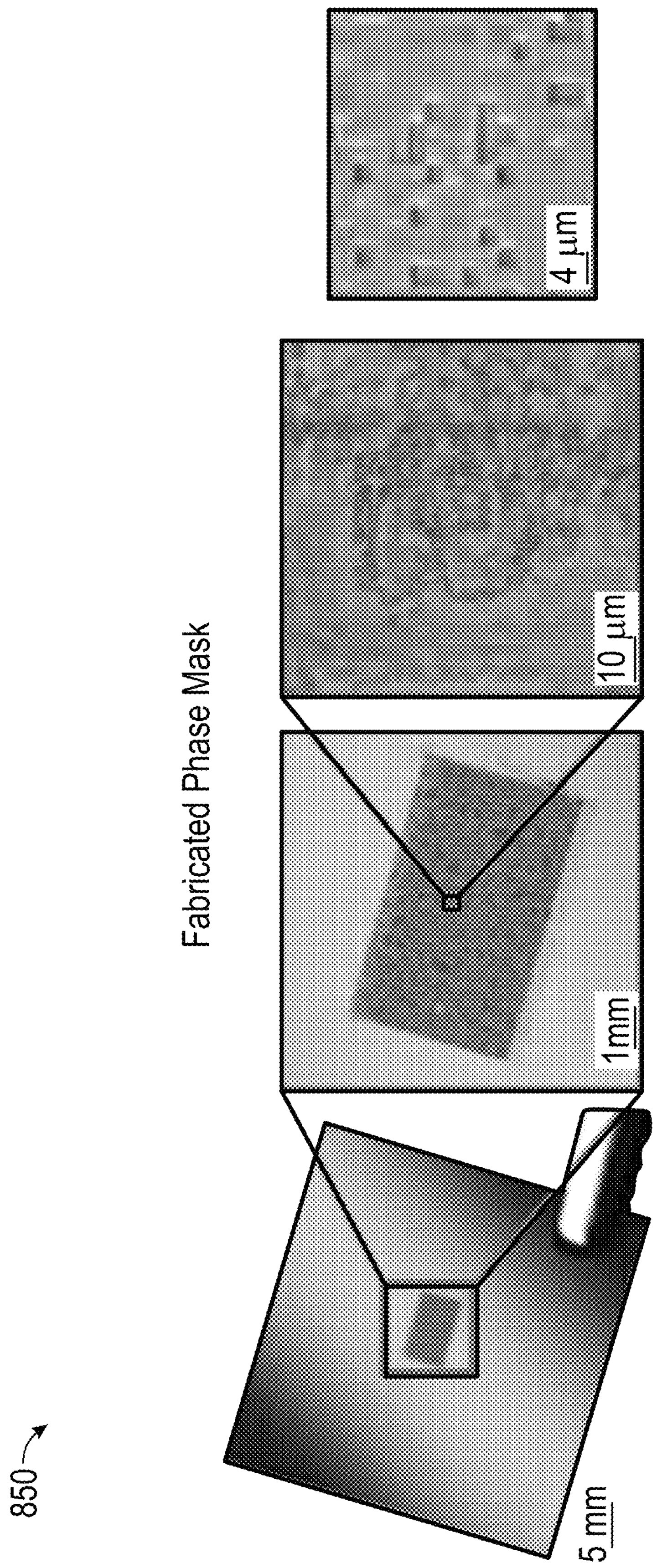
FIG. 8B shows a fabricated phase mask in accordance with one or more embodiments of the invention.

Fabrication: Advancements in fabrication techniques have made it possible for physically realizing diffractive masks with quick turnaround times. In one or more embodiments, a recently developed 2-photon lithography 3D printing system has been used that allows for rapid prototyping of different phase masks without significant overhead preparation. With an optimized final phase mask design, fabrication may be scaled through the manufacturing pipeline such as photolithography and reactive-ion-etching processes. The fabricated phase mask is shown in FIG. 8B. In particular, FIG. 8B shows fabricated phase mask (850) in accordance with one or more embodiments of the invention. The phase masks are essentially transparent material with different heights at different locations. This causes phase modulation of incoming wavefront and resultant wave interference produces the PSF at the imaging sensor plane. FIG. 8B shows the closeup image of the phase mask using embodiments of the lensless camera (100) disclosed herein. The right most image has been taken using Scanning Electron Microscopy (SEM).

Figure 8C:
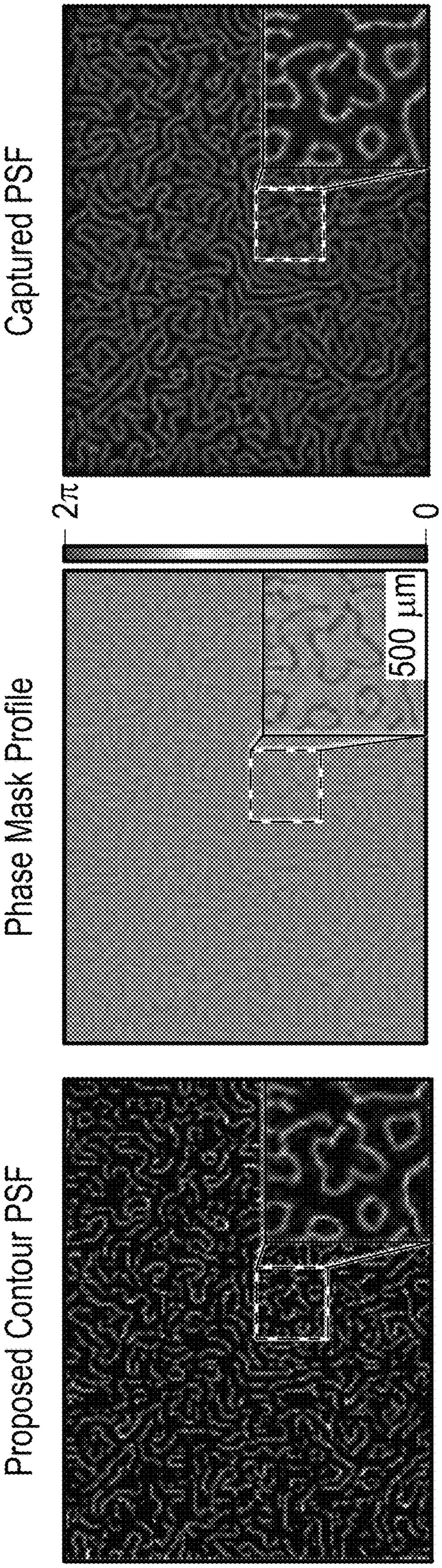
FIG. 8C shows diagrams in accordance with one or more embodiments of the invention.

FIG. 8C shows the contour PSF design, designed phase mask with an optimized phase mask profile, and the experimentally realized PSF from 3D printed phase mask of the lensless camera and comparison of PSFs in accordance with one or more embodiments of the invention. The experimental PSF closely resembles the contour PSF, showing the effectiveness of the phase mask design framework (shown in FIG. 8A).

Also, embodiments disclosed herein describe design of PSF and phase mask optimization as two separate steps. However, in some embodiments, both the steps for the design of PSF and phase mask optimization may be combined in an algorithm for designing the lensless camera.

Many scene analysis techniques operate on textural features extracted from the scene rather than on the images of the scene. One such class of useful features are oriented-edge features derived using oriented-edge filters. In general, a Gabor filter is a linear filter used for texture analysis, which essentially means that it analyzes whether there is any specific frequency content in the image in specific directions in a localized region around the point or region of analysis. Frequency and orientation representations of Gabor filters are similar to those of the human visual system. The Gabor filters have been found to be particularly appropriate for texture representation and discrimination. In the spatial domain, a 2-D Gabor filter is a Gaussian kernel function modulated by a sinusoidal plane wave. The responses of Gabor filters are maximally efficient in terms of information transfer. In other words, these edge filters or generic extraction filters like two-dimensional (2D) Gabor filters are versatile and general-purpose, evident from the fact that they appear in the first layer learned by most image-based neural networks and are also found in the V1 layer of the human visual cortex system.

Figure 9A:
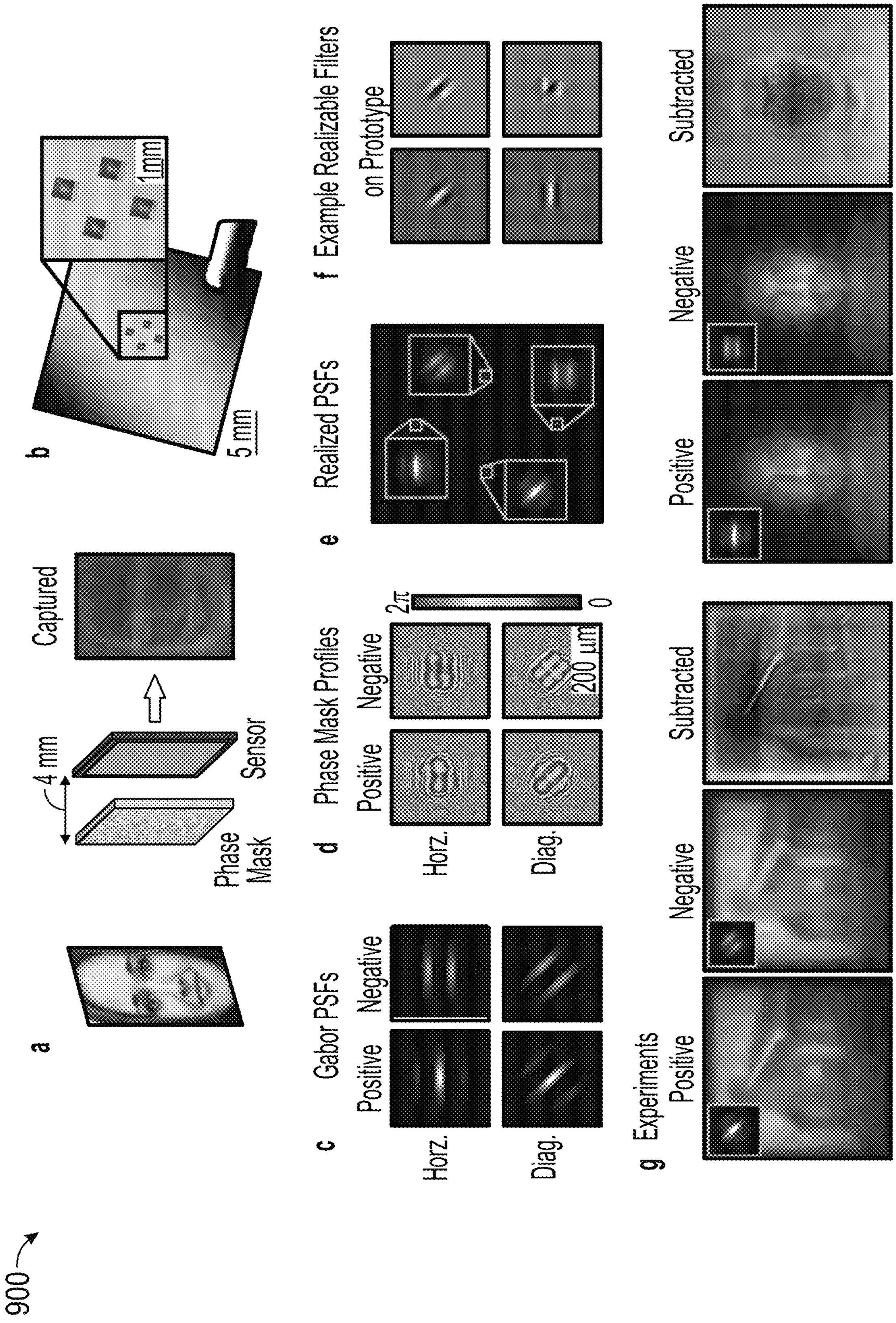
FIGS. 9A and 9B show diagrams in accordance with one or more embodiments of the invention.
Figure 9B:
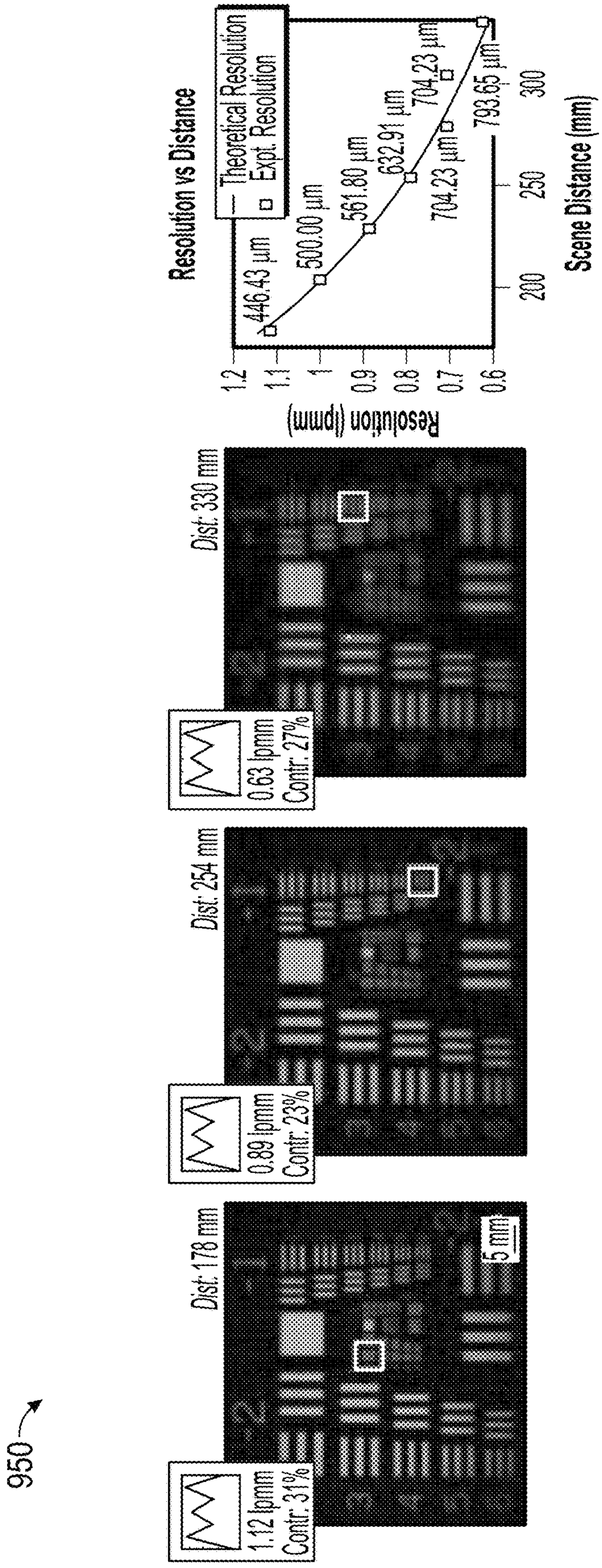

In some embodiments, to show low-level feature extraction, the edge detection Gabor filters are used and phase mask optimization is used to attain a phase mask design in the lensless camera. In particular, Gabor-filtered features, which are optimal for low-level feature extraction tasks, are extracted at different orientations. FIG. 9A shows oriented-edge feature extraction (900) using Gabor filters in accordance with one or more embodiments of the invention. In some embodiments, the Gabor-filtered features may then be passed through neural networks such as Deep CNNs to perform computer vision tasks and artificial intelligence tasks. A machine learning algorithm for performing the computer vision tasks and artificial intelligence tasks may be based on sensor data acquired from the lensless imaging device. The optimality criterion for the design of PSFs for the computer vision and artificial intelligence tasks using data driven techniques are maximum detection performance, maximum classification performance, maximum recognition performance, and minimizing an error in the defined computer vision or artificial intelligence task.

In particular, FIG. 9 shows direct extraction of Gabor features. As described above, the imaging sensor may realize non-negative PSF intensities using equation (1), however, Gabor filters have both positive and negative values. To realize Gabor filters, the filters divided into positive and negative components as shown in FIG. 9A (c) and are considered as new target PSFs with orientations 90° and 45°. Then, 1 mm×1 mm phase masks are optimized as shown in FIG. 9A (d) for each of the PSFs with the device thickness constraint of 4 mm. The phase mask is then fabricated and mounted close to the imaging sensor at the right mask to sensor distance d. The experimentally realized PSF (shown in FIG. 9A (e))—which closely resembles the target PSF (shown in FIG. 9A (c)). The final edge features are then computed by per-pixel subtraction of outputs from the separate phase masks as shown in FIG. 9A (g) at orientations 45° and 90°. Then, the implemented PSFs are combined in different combinations to achieve various filters shown in FIG. 9A (f). The resultant lensless camera is 5× thinner and 20× lighter than general-purpose lens system and directly captures the filtered response instead of going through an image. Additionally, the lensless camera extracts more edge-features than similarly sized previous micro vision sensor and is 12× thinner than Gabor filtering agile sensitive pixel (ASP) camera. In FIG. 9A, the house image shown was captured by displaying on a monitor display while the face was captured directly.

Reconstruction Algorithms

Recovering the scene image from the sensor measurement may pose as a convex optimization problem, where the forward model is the convolution of PSF with the image. In some embodiments, regularization based on image prior is added to the optimization problem to robustify against measurement noise and avoid large amplification of noise in the reconstruction.

Here, slight deviations have been made in the notations from the previously presented equations. In particular, the prominent changes are: 'x' will denote the scene (instead of 'i') and 'd' will denote scene depth (instead of device thickness). In effect, the following minimization problem is solved as follows:

$$\hat{x} = \underset{x\geq 0}{\operatorname{argmin}} \frac{1}{2}\left\|b - \sum_d p_d * x_d\right\|_F^2 + \gamma\mathcal{R}(x) \tag{9}$$

where $\|\cdot|_F$ denotes the Frobenius norm, R(•) denotes the regularization function, and y is the weighting of the regularization.

2D Reconstruction

In one or more embodiments, the reconstruction becomes 2D image reconstruction under two contexts. First, if all the scene elements are sufficiently far (i.e. scene depth>>>device thickness), the dependance of PSF with depth is almost none (equation (6). In such case, $p_d \approx p_\infty$, and $x_d \approx x_\infty$. Second, when refocusing to a particular depth. At both these times, the summation in equation (9) is removed and the following problem is solved as:

$$\hat{x} = \underset{x\geq 0}{\operatorname{argmin}} \frac{1}{2}\|b - p * x\|_F^2 + \gamma\mathcal{R}(x) \tag{10}$$

where $p=p_d$ (or) $p_\infty$, and $x=x_d$ (or) $x_\infty$ according to the context.

A) Fast Reconstruction: For fast reconstructions, in one or more embodiments, Tikhonov regularization ($R(.)=\|\cdot\|_F$) may be used which has a closed form solution given by Wiener deconvolution. Using the Convolution Theorem, the solution may be computed in real time with the Fast Fourier Transform (FFT) algorithm. By differentiating equation (10) and setting to zero, the following solution for the Tikhonov regularized reconstruction is obtained:

$$\hat{x} = \mathcal{F}^{-1}\left(\frac{(\mathcal{F}(p)) * \odot \mathcal{F}(b)}{|\mathcal{F}(p)|^2 + \gamma}\right) \tag{11}$$

where F(•) is the fourier transform operator, (•)* is the complex conjugate operator and '⊙' represents hadamard product.

B) High-fidelity Reconstruction: In some embodiments, the reconstruction quality may be further improved by using total-variation (TV) regularization, which uses the image prior that natural images have sparse gradients. The TV regularized minimization problem is given by:

$$\hat{x} = \underset{x\geq 0}{\operatorname{argmin}} \frac{1}{2}\|b - p * x\|_F^2 + \gamma\|\Psi(x)\|_1 \tag{12}$$

where, Ψ is the 2D gradient operator, and $\|\cdot\|_1$ is the $l_1$ norm. The alternating direction method of multipliers (ADMM) is used to solve equation (12). ADMM is an algorithm that solves convex optimization problems by breaking them into smaller pieces, each of which are then easier to handle.

Let H be the 2D convolution matrix and the following variable splitting is used:

$$\hat{x} = \arg\min_{w\geq 0, z, x} \frac{1}{2}\|b - Hx\|_F^2 + \gamma\|z\|_1 \tag{13}$$
$$\text{s.t. } z = \Psi x,\ w = x.$$

Then the ADMM steps at iteration k are as follows:

$$z^{k+1} \leftarrow S_{\frac{\gamma}{\mu_z}}\left(\Psi x + \rho_z^k / \mu_z\right) \tag{14}$$

$$w^{k+1} \leftarrow \max\left(x + \rho_w^k / \mu_w, 0\right)$$

$$x^{k+1} \leftarrow \left(H^T H + \mu_z \Psi^T \Psi + \mu_w I\right)^{-1} r^k,$$

where, $$r^k = H^T b + \Psi^T\left(\mu_z z^{k+1} - \rho_z^k\right) + \mu_w w^{k+1} - \rho_w^k$$

$S_\mu$ is the soft-thresholding operator with a threshold value of μ, and $\rho_w$ and $\rho_z$ are the Langrage multipliers associated with w and z, respectively. The scalars $\mu_w$ and $\mu_z$ are the penalty parameters that are computed automatically using a tuning strategy. Operations of H and Ψ can be computed using Fast Fourier Transform (FFT), making each step of the ADMM fast.

3D Reconstruction

For 3D imaging, one or more embodiments use both TV and sparsity regularizations and solve using ADMM approach. Let H be the 2D convolution matrix with PSF $p_d$ at depth d. Then the reconstruction problem is posed as:

$$\hat{x} = \underset{x \geq 0}{\operatorname{argmin}} \frac{1}{2}\left\|b - \sum_d H_d x_d\right\|_F^2 + \gamma \sum_d \|\Psi x_d\|_1 + \gamma_1 \|x\|_1 \tag{15}$$

In some embodiments, the following variable splitting is used:

$$\hat{x} = \arg \min_{w \geq 0, z, x} \frac{1}{2}\|b - Sv\|_F^2 + \gamma \sum_d \|z_d\|_1 + \gamma_1 \|t\|_1 \tag{16}$$

$$\text{s.t. } v_a = H_d x_d,\ z_d = \Psi x_d,\ w = x,\ t = x,$$

where $Sv=\Sigma_d v_d$ is the sum along depth operator. Then, the ADMM steps at iteration k are as follows:

$$v_d^{k+1} \leftarrow \left(S^T S + \mu_v I\right)^{-1}\left(S^T b + \mu_v H_d x_d^k + \rho_v^k\right) \tag{17}$$

$$z_d^{k+1} \leftarrow S_{\frac{\gamma}{\mu_z}}\left(\Psi x_d^k + \rho_z^k / \mu_z\right)$$

$$w^{k+1} \leftarrow \max\left(x^k + \rho_w^k / \mu_w, 0\right)$$

$$t^{k+1} \leftarrow S_{\frac{\gamma_1}{\mu_t}}\left(x^k + \rho_t^k / \mu_t\right)$$

$$x_d^{k+1} \leftarrow \left(\mu_v H_d^T H_d + \mu_z \Psi^T \Psi + \mu_w I + \mu_t I\right)^{-1} r_d^k,$$

where, $$r_d^k = H_d^T\left(\mu_v v^{k+1} - \rho_v^k\right) + \Psi^T\left(\mu_z z_d^{k+1} - \rho_z^k\right) + \mu_w w^{k+1} - \rho_w^k + \mu_t t^{k+1} - \rho_t^k \tag{18}$$

$S_\mu$ is the soft-thresholding operator with a threshold value of μ, and $\rho_w$, $\rho_t$, and ρd are the Langrage multipliers associated with w, t and z, respectively. The scalars $\mu_w$, $\mu_t$, and $\mu_z$ are the penalty parameters that are computed automatically using a tuning strategy. Operations of $H_d$, Ψ, and S can be computed using Fast Fourier Transform (FFT), making each step of the ADMM fast.

In one or more embodiments, the above 3D algorithm uses the summing operator S which makes each iteration of ADMM much more stable and results in high quality reconstruction within a few iterations.

Imaging Prototype

A) Prototype preparation: In some embodiments, a contour-based PSF with 14% sparsity from Perlin noise is generated. The continuous phase mask profiles (in radians) are optimized at 532 nm wavelength of light with 2 μm spatial resolution to produce the PSF at sensor to mask distance of 1.95 mm. The height map of the phase-mask is computed for the mask substrate with refractive index of 1.52. The height map was further discretized into height steps of 200 nm to fit the specifications of fabrication.

The phase mask is fabricated using two-photon lithography 3D printer (Photonic Professional GT, Nanoscribe GmbH). The phase mask is printed on a 700 μm thick, 25 mm square fused silica glass substrate using Nanoscribe's IP-DIP photoresist in a Dip-in Liquid Lithography (DiLL) mode with a 63× microscope objective lens. The IP-DIP has a refractive index of 1.52. The fabricated phase mask is shown in FIG. 8B.

In one or more embodiments, a FLIR Blackfly S color camera with Sony IMX183 sensor is used to build the prototype. Without binning, the pixel pitch per color channel is 4.8 μm, and with binning, the pixel pitch per color channel is 9.6 μm. The camera housing was replaced with a 3D printed housing to get unobstructed access to the protective glass on the sensor. The phase mask is affixed (face down) on the protective glass of the sensor using double-sided adhesive carbon tape. Two layers of carbon tape are sufficient to attain the desired distance (1.95 mm) between the phase mask and the sensor, the distance at which the PSFs appear the sharpest. The affixing carbon tape also acted as a square aperture (6.7 mm×5.3 mm) to restrict the shifts of the PSF to be within the image sensor.

In addition, one or more embodiments elate to an efficient calibration method for lensless imaging devices.

B) Calibration: Calibration of lensless imaging systems can be time consuming and computationally intensive. There can be discrepancies between the physically implemented PSFs and the target engineered PSFs due to phase mask height discretization and fabrication inaccuracies. Embodiments disclosed herein utilize a method in which a single (or few) capture(s) pinpoint the relative location of the (amplitude or phase) mask and an optimized algorithm to extrapolate calibration matrices for all depths of interest. Given a 1024×1024 pixel scene and sensor, this method may result in ~2000×-4000× reduction in time and hard-drive requirements compared to previous methods. Additionally, these steps lead to a quick path to use a single calibration for multiple devices. Implementation of this calibration method is especially important toward commercialization and may allow quicker testing of future mask designs. These methods are applicable to both in the photographic and microscopic regimes.

One or more embodiments only require a single (to a few) images to calibrate a lensless device for any desired resolution. Previous calibration processes required multiple captured images dependent on desired resolution, for example a 1 MP scene required a minimum of 2048 images (4096 for low-light throughput). Taking these images in sequence might take several minutes to hours for calibrating a single device. In contrast, a calibration technique of some embodiments only requires a few images reducing the time needed to a few seconds.

Current calibration techniques require each device to be separately calibrated. However, one or more embodiments disclosed herein relate to fabrication and calibration technique developed that allows calibration on a single device to be used for a large number of devices that were fabricated using the same mask under certain tolerances during fabrication.

Figure 10A:
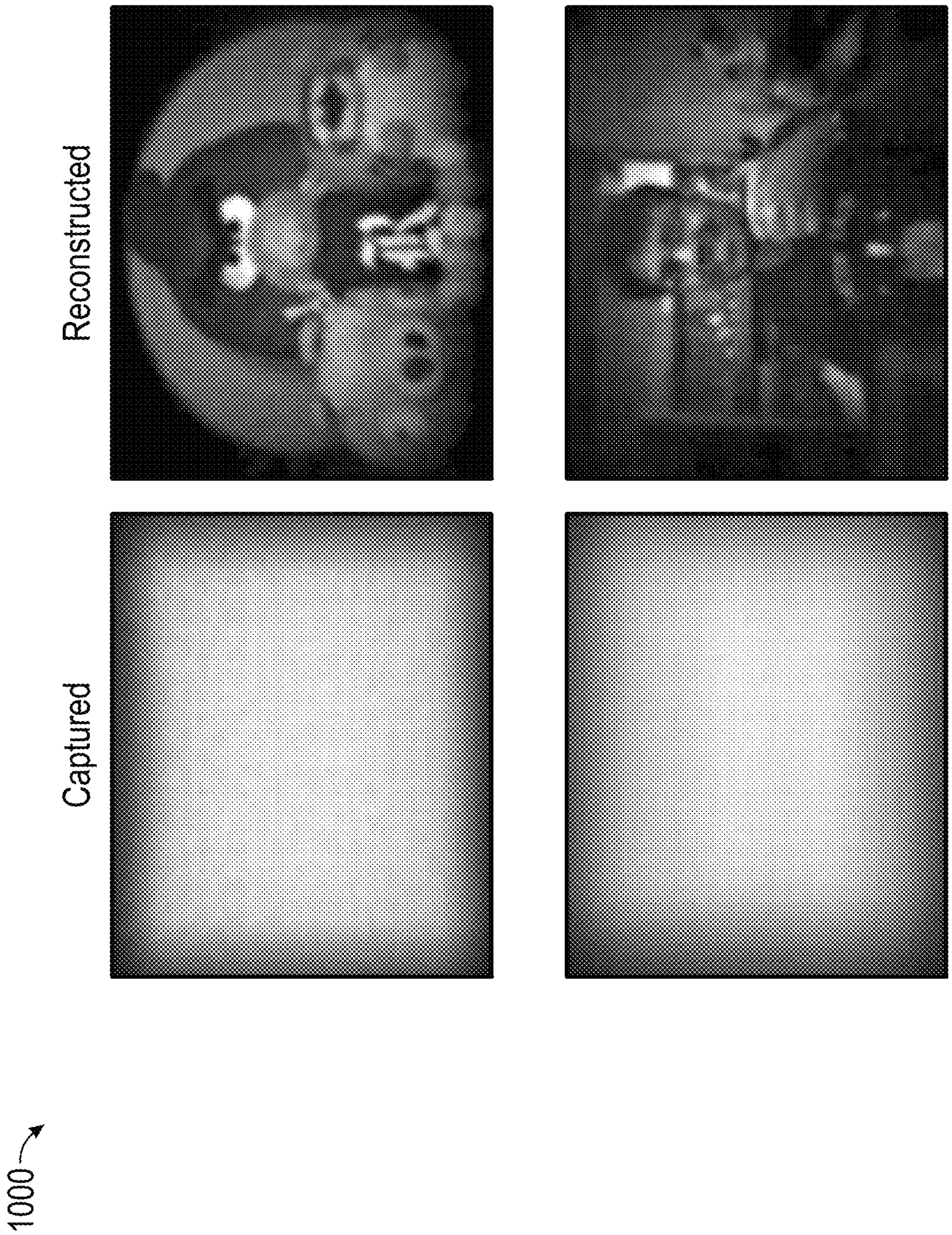
FIGS. 10A and 10B show diagrams in accordance with one or more embodiments of the invention.

In particular, the PSFs are experimentally captured and these PSFs are used for computation. A point source is approximated by back illuminating a pinhole aperture and capturing sensor data by placing prototypes at different desired depths. For a plot (950) shown in FIG. 9B, PSFs are captured at distances ranging from 7 in (~178 mm) to 13 in (~330 mm), with steps of 1 in (25.4 mm) using a pinhole aperture of 1 mm diameter in an experimental evaluation of the lensless camera's resolution using fluorescent USAF target. For photography examples in FIGS. 10A and 12C, PSF is captured at 16 in (~406 mm). In FIG. 10A, the shortest distance to the scene is about 0.5m, extending all the way to 3m in the bottom scene. The bottom scene is a frame from video reconstruction.

Figure 10B:
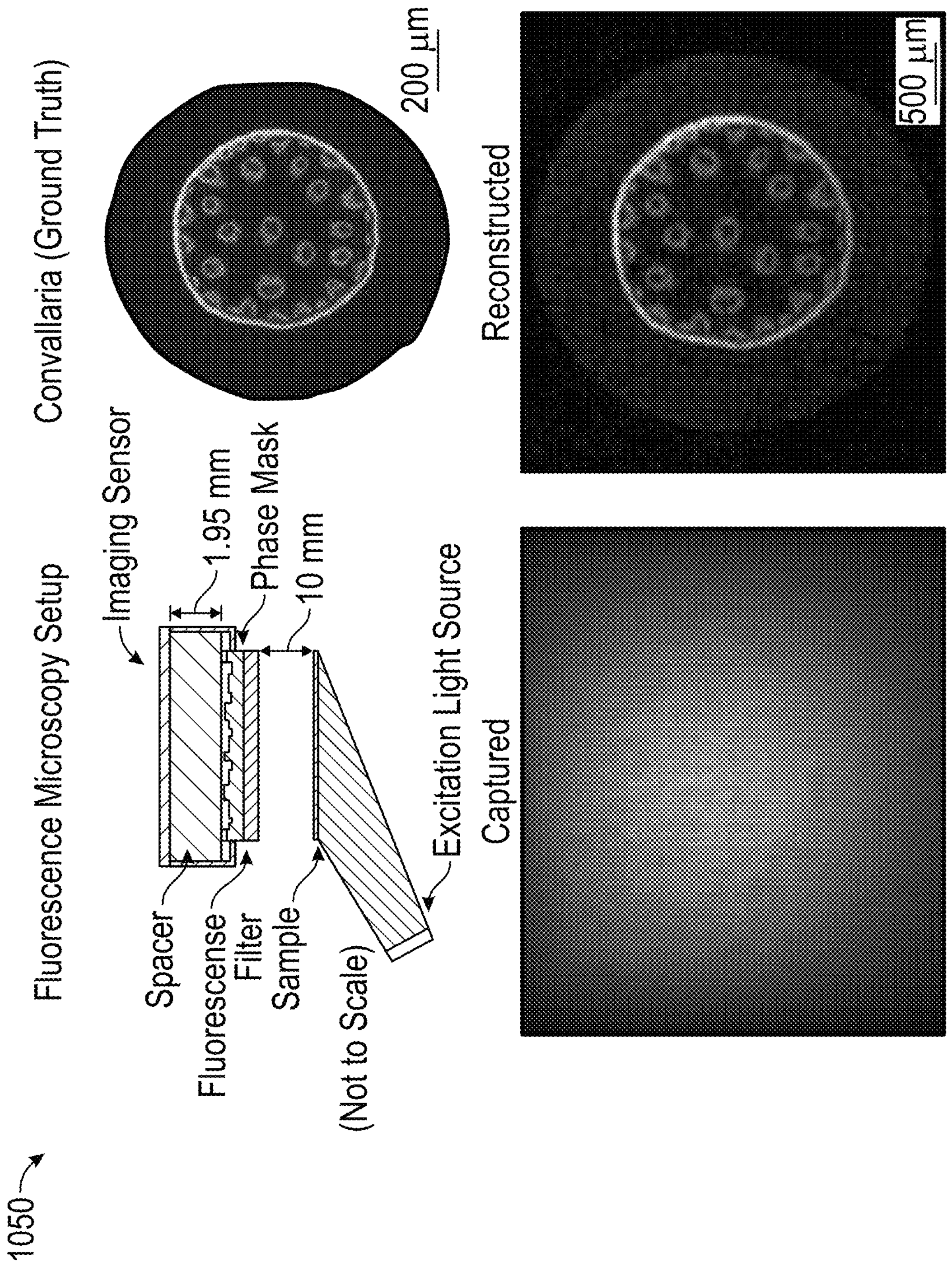

The PSF for microscopy example (FIG. 10B) is captured at 10 mm from the fluorescence filter using a pinhole aperture of 15 μm diameter. In FIG. 10B, fluorescence microscopy setup is shown at top-left. Top-right of FIG. 10B shows ground truth image of fluorescent sample taken using 2:5 microscope objective lens. The sample is a root cell from lily-of-the-valley (*Convallaria majalis*) stained with green fluorescent dye. For refocusing (FIG. 12A) and 3D imaging (FIG. 12B), PSFs are captured at distances ranging from 10 mm to 110 mm, with steps: 1 mm for range 10-30 mm, and 5 mm for range 30-110 mm, using a pinhole aperture of 250 μm diameter.

Figure 12A:
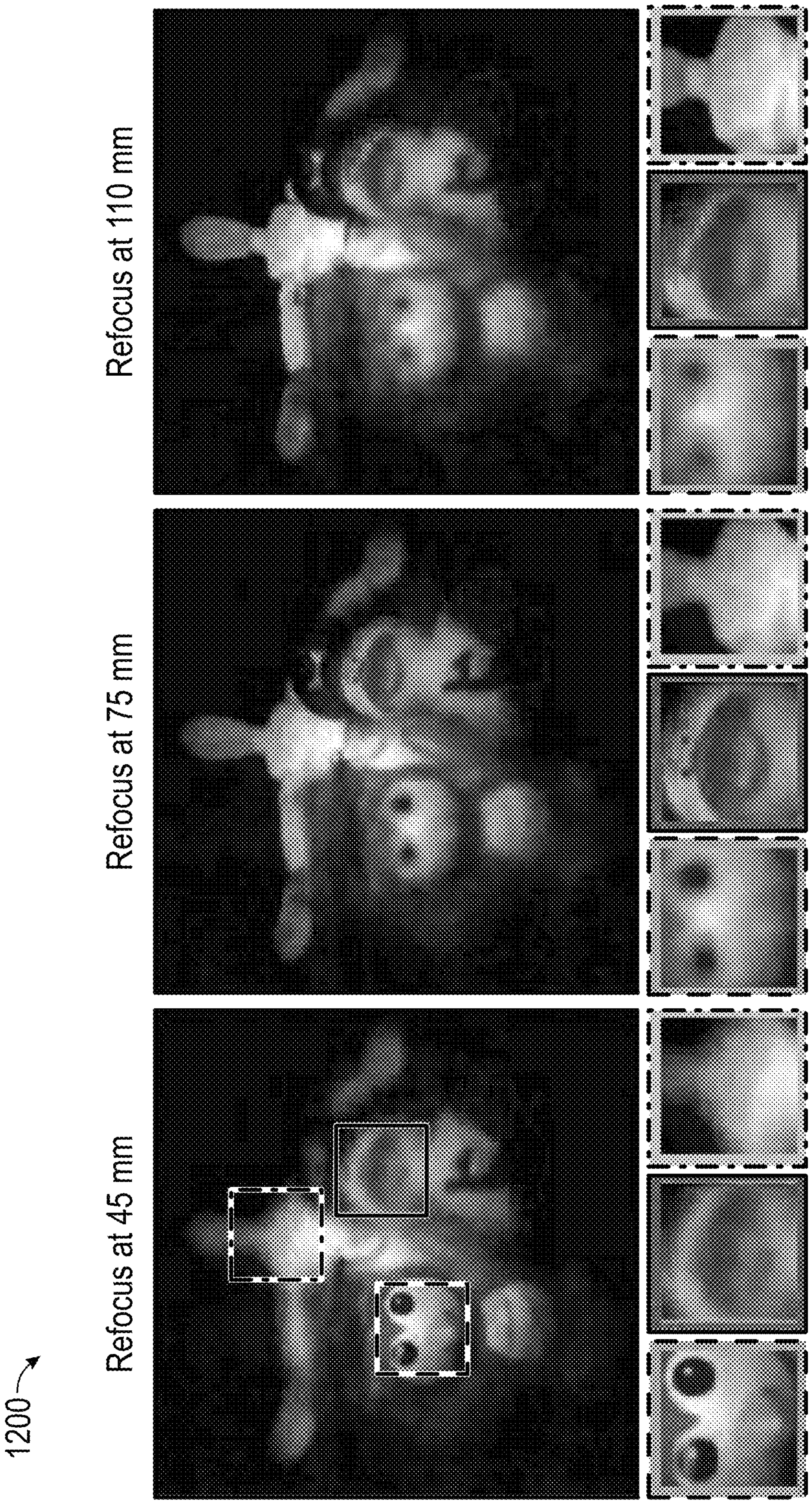
FIGS. 12A-12C show diagrams in accordance with one or more embodiments of the invention.
Figure 12B:
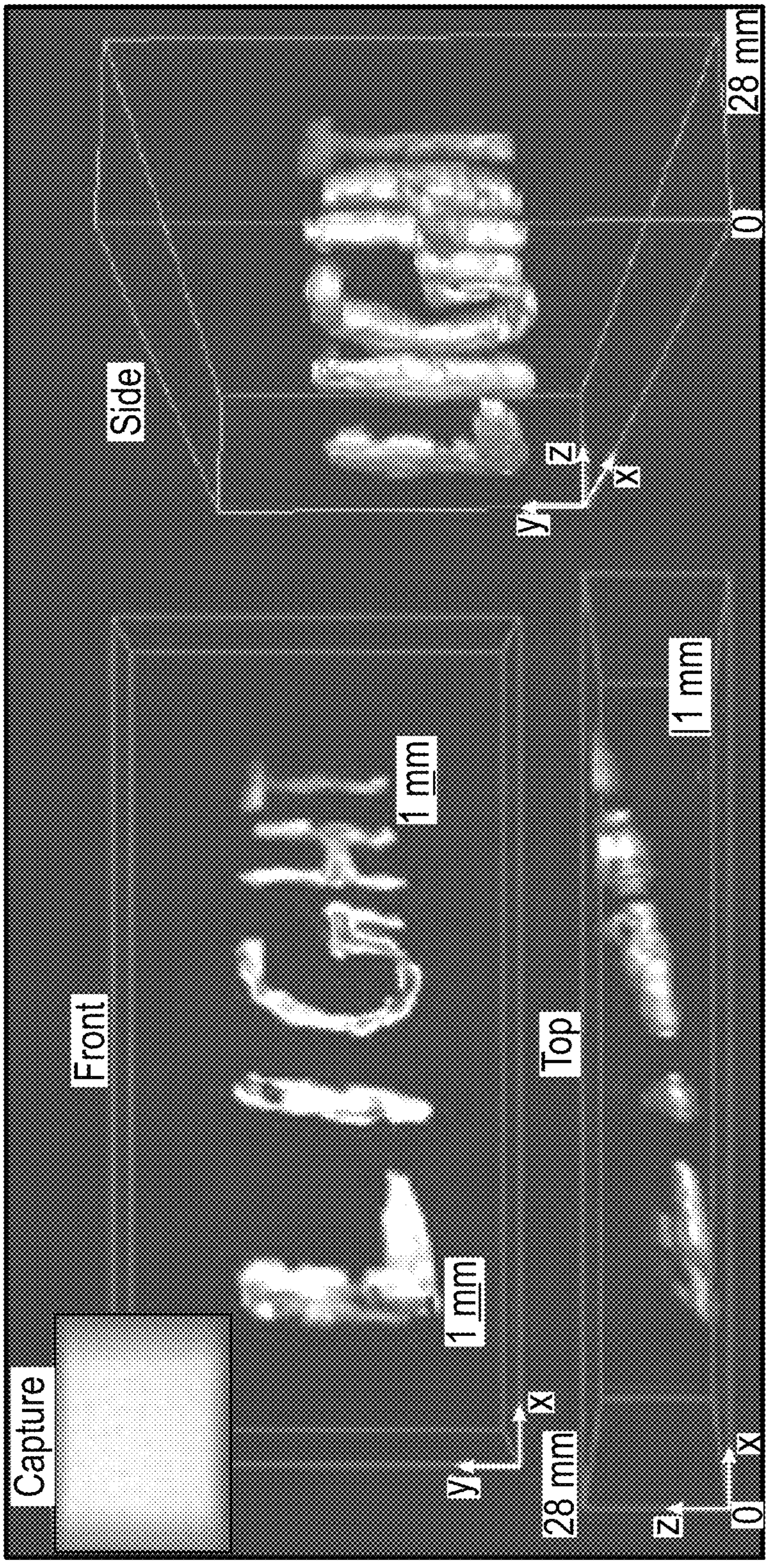

In FIG. 12A, the refocusing ability of the lensless camera is shown. Three objects at three different distances come into focus when the appropriate depth PSF for the reconstruction is used. These reconstructions are produced from a single capture. In FIG. 12B, the 3D image reconstruction ability of the lensless camera at a very close distance is shown. The scene is a handwritten text, written using phosphorescent paint. The letter 'L' is at the closest distance from the camera, at 10 mm, and the letter 'T' is at 38 mm from the camera. Hence, the scene ranges from 0 to 28 mm.

Resolution Characterization

In some embodiments, from the lensless camera geometry, theoretical upper-limit resolution of a lensless camera may be derived as:

$$\text{Resolvable feature} = \frac{\text{Mask-Scene distance}}{\text{Mask-Sensor distance}}(\text{Pixel pitch}) \tag{19}$$

From experimental testing using fluorescent USAF target, using contour PSF achieves close to theoretical resolution as shown in FIG. 9A. The pixel pitch of the camera is 4.8 μm.

Depth-Dependance Characterization

Figure 11:
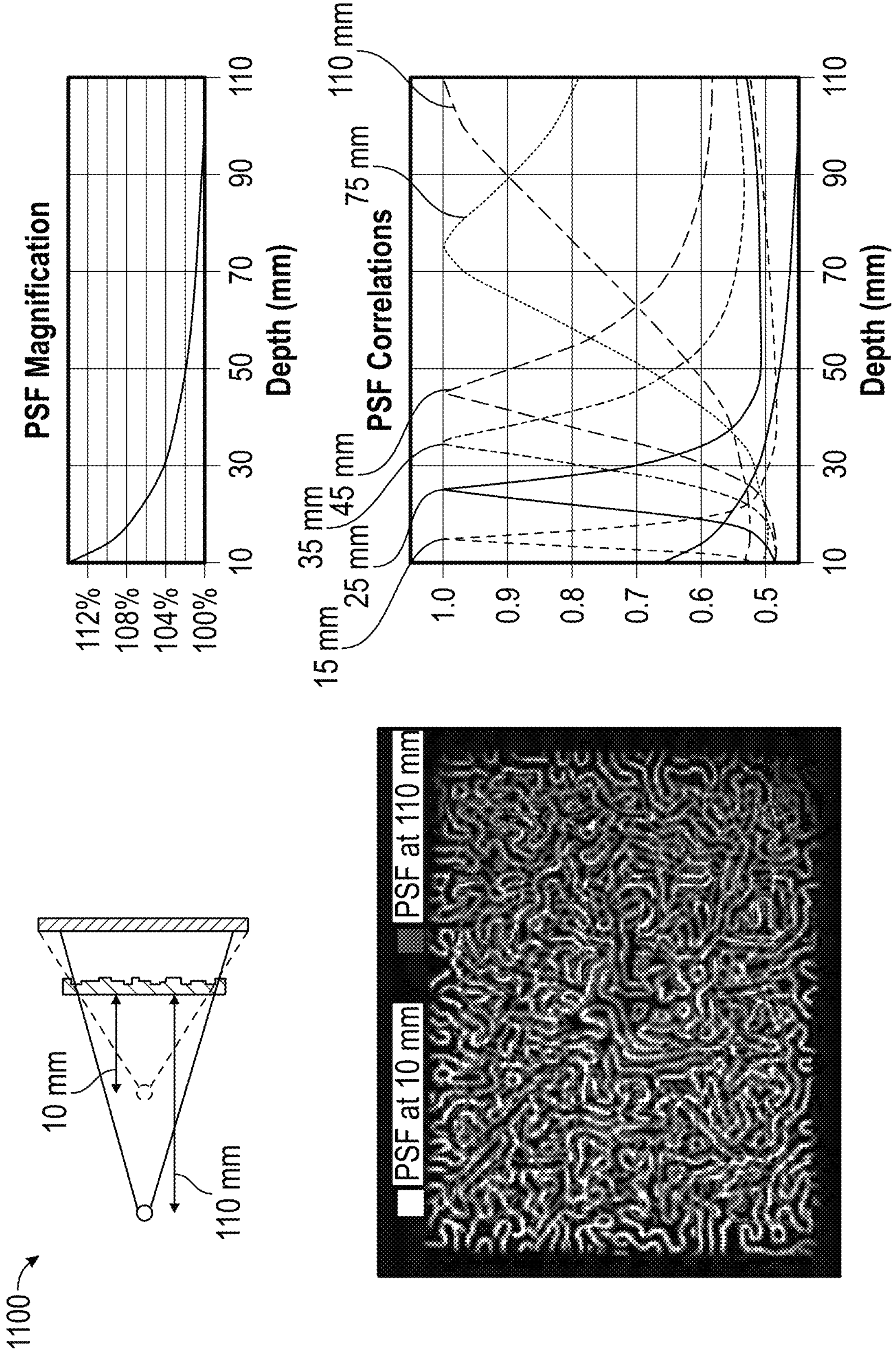
FIG. 11 shows plots in accordance with one or more embodiments of the invention.

In one or more embodiments, the lensless camera has depth-dependent PSF that may be exploited for refocusing scenes at different depths and also to perform 3D imaging. The effect of depth on PSF is magnification or scaling, where the PSF shrinks at the rate of 1/depth as the scene depth increases (equation (5)). This effect is a direct outcome of Fresnel propagation. The correlation of PSFs rapidly decreases at closer depths and has broader correlation profiles at farther depths. This property can be used for 2D imaging at far depths, computational depth refocusing of scenes at medium depth range, and 3D imaging of scenes at a closer depth range. FIG. 11 shows the magnification and correlation of the depth-dependent PSFs. The lensless camera has depth dependent PSF that magnifies as the scene gets closer. The magnification falls with inverse depth relation. By looking at the correlation of PSFs, scene depth is broadly categorized into 3 regimes. At close distances, the correlation falls quickly, enabling to reconstruct 3D images. At the medium distances, the correlation falls gradually over a wider depth range. In this distance range, computational refocusing is performed. At much larger depth, the dependence of PSF with depth saturates and all far scene points may be said to be beyond the hyperfocal distance of the lensless camera, thereby allowing only reconstruction of 2D images.

Imaging Experiments

Figure 12C:
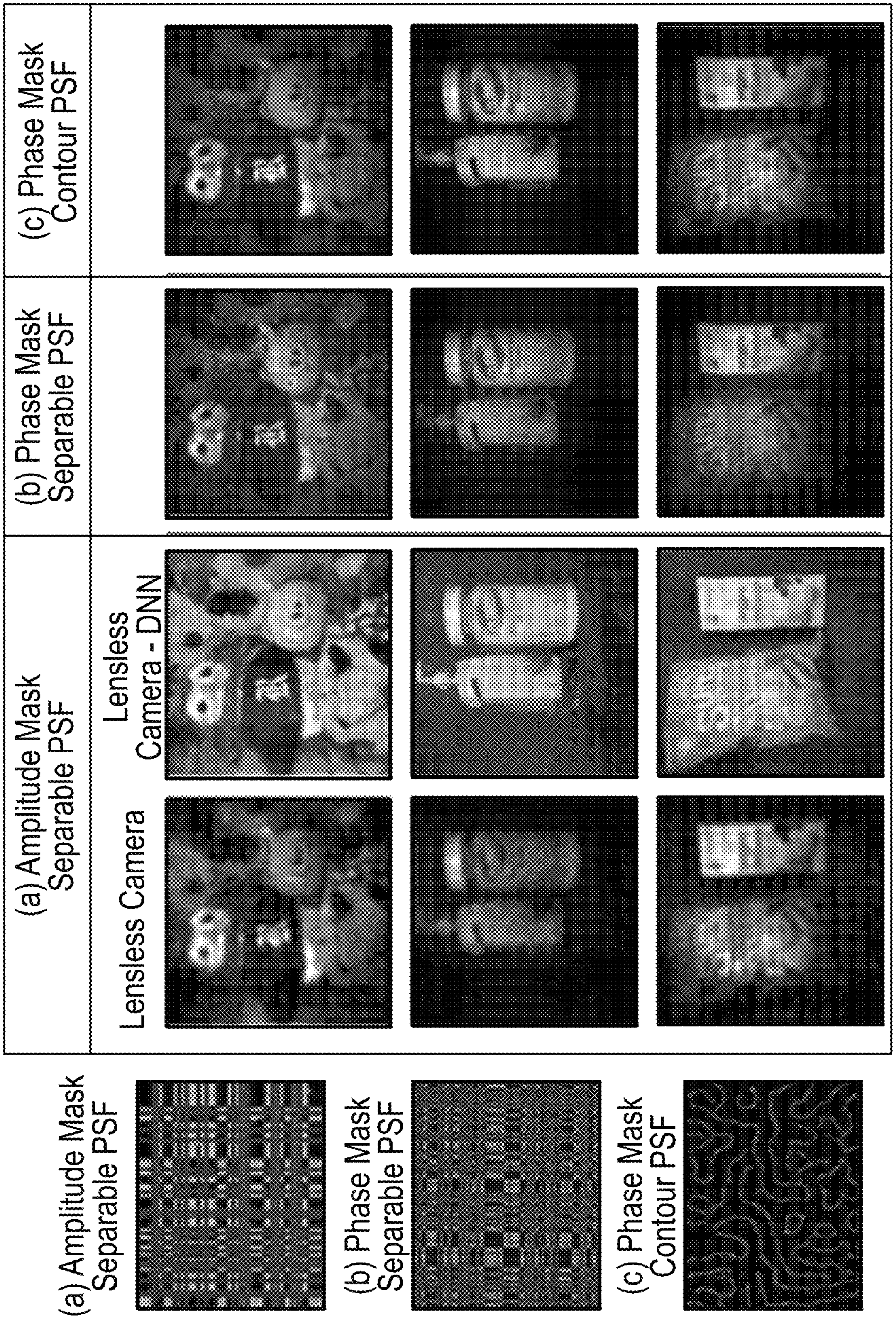

A) 2D Imaging: 2D imaging using lensless camera under various scenarios is with photography experiments are shown in FIGS. 10A and 12C, while microscopy experiment is shown in FIG. 10B. In one or more embodiments, for all the reconstructions, the camera is 2× 2 binned to have a pixel pitch of 9.6 μm.

FIG. 12C further compares the lensless camera with two other prototypes: (a) amplitude mask designed for separable PSF, (b) phase mask designed for separable PSF, and (c) phase mask designed for Contour PSF. The lensless camera reconstructions are performed using Tikhonov regularization, and using deep learning method. Both the phase-mask reconstructions are performed with equation (10). The lensless camera produces cleaner and higher quality images.

B) Image Refocusing: At medium depth ranges, the depth-dependent PSFs uncorrelate slowly. Hence, the exact 3D reconstruction would be ill-conditioned. However, the PSF correlation fall-off may be exploited for performing computational refocusing from single captured measurements. In one or more embodiments, refocusing is performed by reconstructing the image from the single capture by choosing the appropriate depth PSF. Scene points away from the selected depth appear blurry while the scene points at the selected depth plane appear sharp as shown in FIG. 12A.

C) 3D Imaging: At very close depth range, the depth-dependent PSFs uncorrelate at a fast rate. This property may be exploited to perform 3D imaging in some embodiments, as shown in FIG. 12B.

Figure 12D:
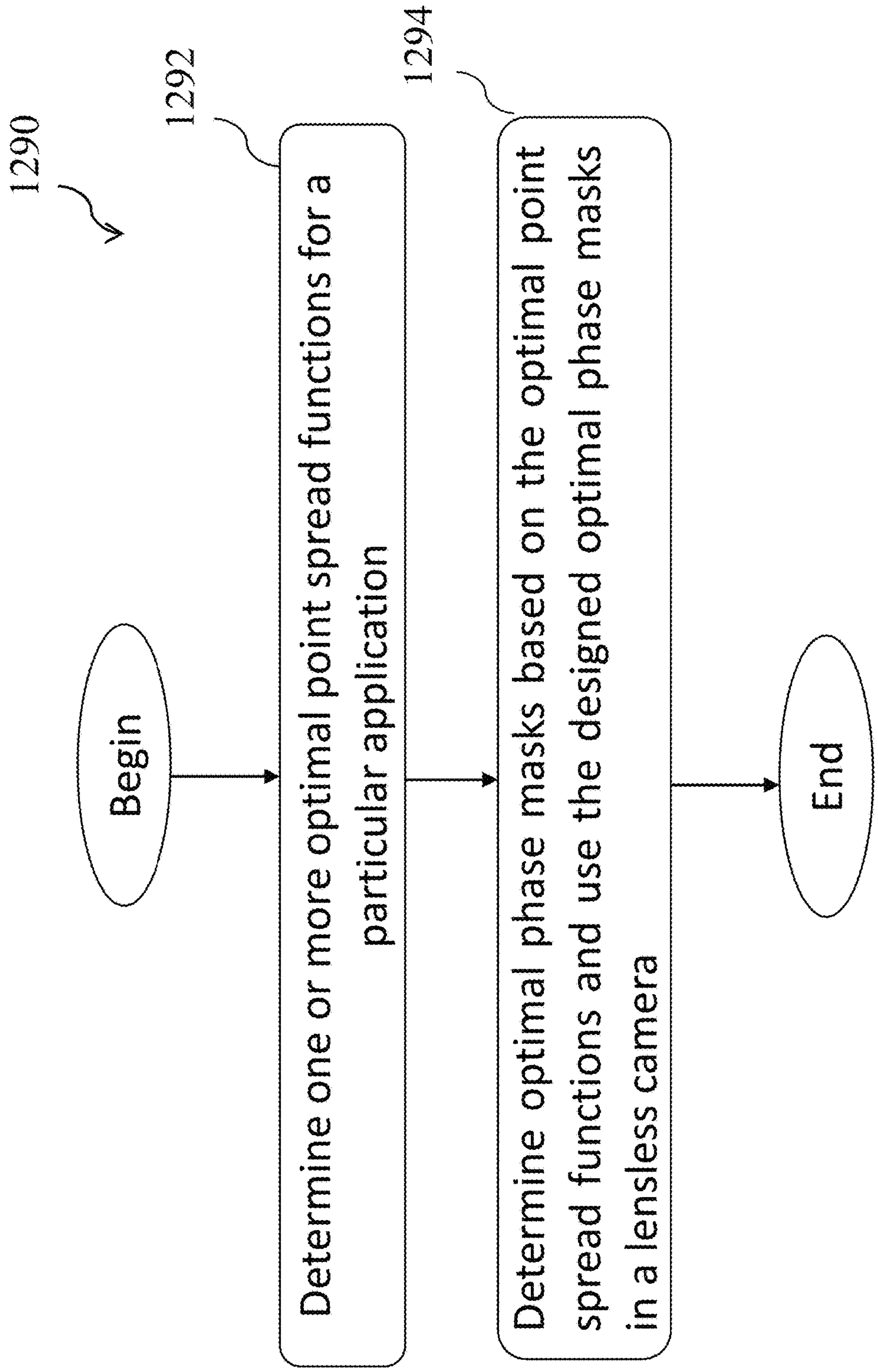
FIG. 12D shows a flowchart in accordance with one or more embodiments of the invention.

FIG. 12D shows a flowchart (1290) in accordance with one or more embodiments. Specifically, FIG. 12D describes a general method for designing and optimizing a lensless imaging device. One or more steps in FIG. 12D may be performed by one or more components (for example, collimated laser (102), phase mask (106), imaging sensor (108), NfPR (400)) as described in FIGS. 1A, 4B, 7B, and 9A. While the various steps in FIG. 12D are presented and described sequentially, one of ordinary skill in the art will appreciate that some or all of the steps may be executed in different orders, may be combined, or omitted, and some or all of the steps may be executed in parallel. Furthermore, the steps may be performed actively or passively. The method may be repeated or expanded to support multiple components and/or multiple users within a field environment. Accordingly, the scope of the invention should not be considered limited to the specific arrangement of steps shown in the flowchart.

In step 1292, one or more optimal point spread functions for a particular application are determined in accordance with one or more embodiments of the invention. In particular, the imaging sensor (for example, imaging sensor (108)) may realize non-negative PSF intensities using equation (1) and PSFs with orientation using Gabor filters, for example, the contour-based PSF and associated phase to achieve the highest resolution for imaging applications described previously in FIGS. 1A, 4B, 7B, and 9A.

In step 1294, optimal phase masks are determined based on the optimal point spread functions and the designed optimal phase masks are used in a lensless camera in accordance with one or more embodiments of the invention. In particular, phase masks are optimized for each of the PSFs, for example, 1 mm×1 mm phase masks are optimized as shown in FIG. 9A (d) for each of the PSFs with the device thickness constraint of 4 mm. The phase mask is then fabricated and mounted close to the imaging sensor at the right mask to sensor distance d described previously in FIGS. 1A and 9A. In some embodiments, the final edge features are then computed by per-pixel subtraction of outputs from the separate phase masks as shown in FIG. 9A at orientations 45° and 90°. Then, the implemented PSFs are combined in different combinations to achieve various filters described previously in FIG. 9A.

In other words, the embodiments of the invention explore PSFs for imaging and Gabor filtering. The same technique may be used to explore point spread functions that are specific to other applications like face detection, object classification, and many more. This may also be particularly important in cases such as a multiwavelength phase mask optimization to provide more color fidelity. Embodiments disclosed herein have direct impact on the speed and efficiency of calibrating lensless imaging systems. The calibration process of one or more embodiments in conjunction with the capability of using a single calibration data for multiple devices could enable mass-production of lensless devices for commercialization with minimal computation. The time required for calibration is one of the most critical features for commercializing the lensless imaging technologies. Reducing the total number of calibration images required directly reduces the total time needed for calibration. This would allow for scalability of the technology.

Figure 13A:
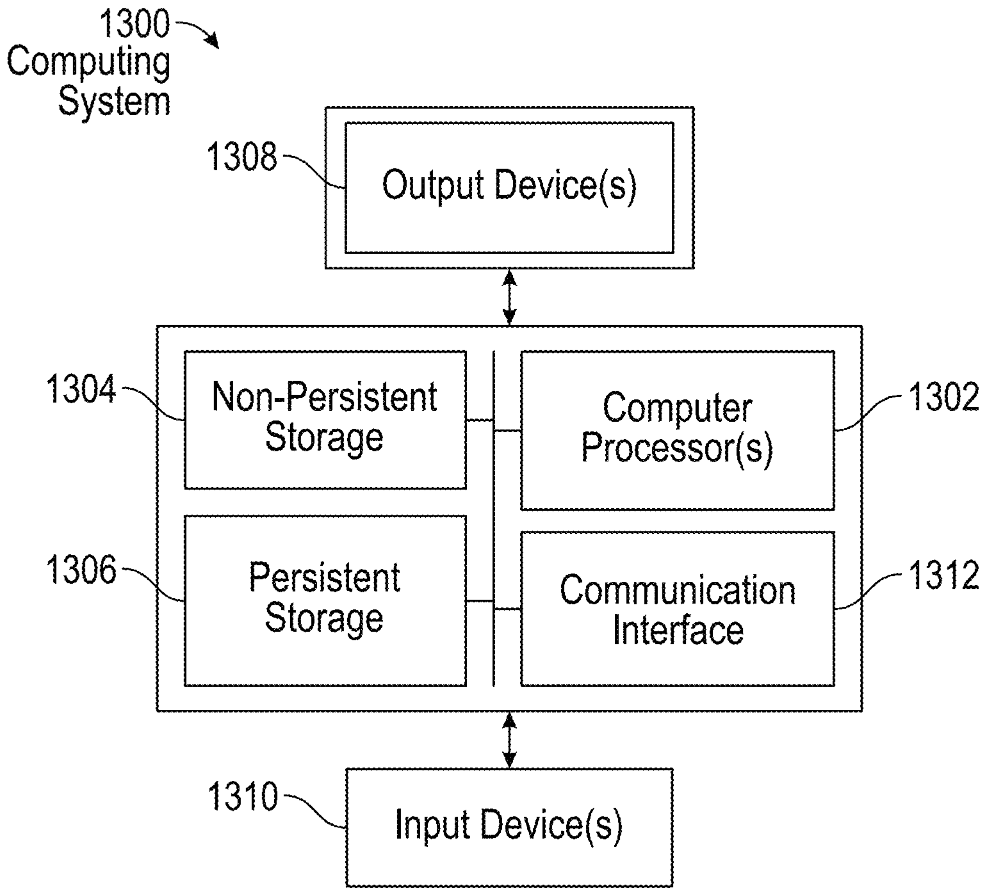
FIGS. 13A and 13B show diagrams in accordance with one or more embodiments of the invention.

Embodiments may be implemented on a computing system. Any combination of mobile, desktop, server, router, switch, embedded device, or other types of hardware may be used. For example, as shown in FIG. 13A, the computing system (1300) may include one or more computer processors (1302), non-persistent storage (1304) (e.g., volatile memory, such as random access memory (RAM), cache memory), persistent storage (1306) (e.g., a hard disk, an optical drive such as a compact disk (CD) drive or digital versatile disk (DVD) drive, a flash memory, etc.), a communication interface (1312) (e.g., Bluetooth interface, infrared interface, network interface, optical interface, etc.), and numerous other elements and functionalities.

The computer processor(s) (1302) may be an integrated circuit for processing instructions. For example, the computer processor(s) may be one or more cores or micro-cores of a processor. The computing system (1300) may also include one or more input devices (1310), such as a touchscreen, keyboard, mouse, microphone, touchpad, electronic pen, or any other type of input device.

The communication interface (1312) may include an integrated circuit for connecting the computing system (1300) to a network (not shown) (e.g., a local area network (LAN), a wide area network (WAN) such as the Internet, mobile network, or any other type of network) and/or to another device, such as another computing device.

Further, the computing system (1300) may include one or more output devices (1308), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (1302), non-persistent storage (1304), and persistent storage (1306). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosure.

Figure 13B:
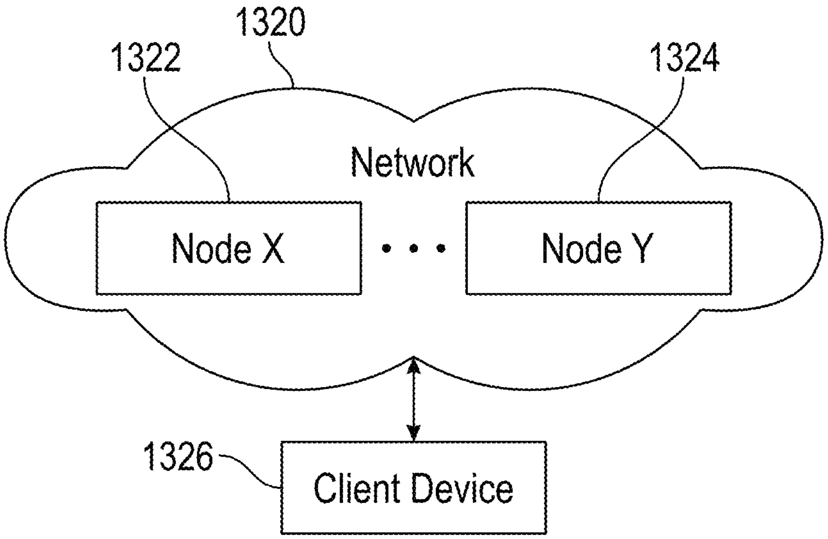

The computing system (1300) in FIG. 13A may be connected to or be a part of a network. For example, as shown in FIG. 13B, the network (1320) may include multiple nodes (e.g., node X (1322), node Y (1324)). Each node may correspond to a computing system, such as the computing system shown in FIG. 13A, or a group of nodes combined may correspond to the computing system shown in FIG. 13A. By way of an example, embodiments of the disclosure may be implemented on a node of a distributed system that is connected to other nodes. By way of another example, embodiments of the disclosure may be implemented on a distributed computing system having multiple nodes, where each portion of the disclosure may be located on a different node within the distributed computing system. Further, one or more elements of the aforementioned computing system (1300) may be located at a remote location and connected to the other elements over a network.

Although not shown in FIG. 13B, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (1322), node Y (1324)) in the network (1320) may be configured to provide services for a client device (1326). For example, the nodes may be part of a cloud computing system. The nodes may include functionality to receive requests from the client device (1326) and transmit responses to the client device (1326). The client device (1326) may be a computing system, such as the computing system shown in FIG. 13A. Further, the client device (1326) may include and/or perform all or a portion of one or more embodiments of the disclosure.

The computing system or group of computing systems described in FIGS. 13A and 13B may include functionality to perform a variety of operations disclosed herein. For example, the computing system(s) may perform communication between processes on the same or different systems. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel end-points enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until the server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope of the disclosure. The processes may be part of the same or different application and may execute on the same or different computing system.

Rather than or in addition to sharing data between processes, the computing system performing one or more embodiments of the disclosure may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the disclosure, may extract one or more data items from the obtained data. For example, the extraction may be performed as follows by the computing system (1300) in FIG. 13A. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail-such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 13A, while performing one or more embodiments of the disclosure, may perform data comparison. Data comparison may be used to compare two or more data values (e.g., A, B). For example, one or more embodiments may determine whether A>B, A=B, A!=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments of the disclosure, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 13A may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 13A may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions presents only a few examples of functions performed by the computing system of FIG. 13A and the nodes and/or client device in FIG. 13B. Other functions may be performed using one or more embodiments of the disclosure.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

What is claimed is:

1. A method for designing and optimizing a lensless imaging device comprising:

determining one or more optimal point spread functions for a particular application; and determining optimal phase masks based on the one or more optimal point spread functions and using the designed optimal phase masks in a lensless camera, wherein the one or more optimal point spread functions are contour-based point spread functions that are optimal for imaging applications, wherein the contour-based point spread functions are realized by applying an edge filter on a two-dimensional procedural noise field.

2. The method according to claim 1, wherein the procedural noise is a Perlin noise.

3. The method according to claim 1, wherein the one or more optimal phase masks are computed by solving a phase retrieval algorithm using the contour-based point spread functions as an intensity at a sensor plane.

4. The method according to claim 3, wherein the phase retrieval algorithm is based on iteratively enforcing constraints on the sensor plane and a phase mask plane.

5. The method according to claim 1, wherein the one or more optimal point spread functions are designed using edge detection or generic extraction filters comprising two-dimensional (2D) Gabor filters which are optimal for low-level feature extraction tasks.

6. The method according to claim 1, wherein the one or more optimal point spread functions are designed using template matching features which are optimal for template matching applications.

7. The method according to claim 1, wherein the one or more optimal point spread functions are learned to be optimal for vision and artificial intelligence tasks using data driven techniques.

8. The method according to claim 7, wherein a learning algorithm to obtain the one or more optimal point spread functions is based on a neural network.

9. The method according to claim 7, wherein a machine learning algorithm is directly used to compute computer vision and artificial intelligence task results based on sensor data acquired from the lensless imaging device.

10. The method according to claim 7, wherein an optimality criterion for a point spread function design is maximum detection performance.

11. The method according to claim 7, wherein an optimality criterion for a point spread function design is maximum classification performance.

12. The method according to claim 7, wherein an optimality criterion for a point spread function design is maximum recognition performance.

13. The method according to claim 7, wherein an optimality criterion for a point spread function design is minimizing an error in a defined computer vision or artificial intelligence task.

14. The method according to claim 1, wherein the lensless imaging device is calibrated by:

capturing a single point spread function; and extrapolating calibration matrices.

15. The method according to claim 14, wherein the single point spread function is captured by taking an image of a point light source using the lensless imaging device.

16. The method according to claim 14, wherein the single point spread function is captured by taking an image of a high contrast known calibration target and using an optimization algorithm to estimate the point spread function that minimizes an error between the captured image on the lensless imaging device and a predicted image.

17. A non-transitory computer readable medium storing instructions, the instructions executable by a computer processor and comprising functionality for:

determining one or more optimal point spread functions for a particular application; and determining optimal phase masks based on the one or more optimal point spread functions and using designed optimal phase masks in a lensless camera, wherein the one or more optimal point spread functions are contour-based point spread functions that are optimal for imaging applications, wherein the contour-based point spread functions are realized by applying an edge filter on a two-dimensional procedural noise field.

18. A method for designing and optimizing a lensless imaging device comprising:

determining an optimal point spread function for a particular application; and determining the optimal phase mask based on the optimal point spread function and using the designed optimal phase mask in a lensless camera, wherein:

the one or more optimal point spread functions are learned to be optimal for vision and artificial intelligence tasks using data driven techniques, and an optimality criterion for a point spread function design is maximum classification performance.

19. The method according to claim 18, wherein the one or more optimal point spread functions are contour-based point spread functions that are optimal for imaging applications.

* * * * *